(12) United States Patent
Honda et al.

(10) Patent No.: US 6,269,552 B1
(45) Date of Patent: Aug. 7, 2001

(54) METHOD OF DRYING SUBSTRATES AND DRYING APPARATUS

(75) Inventors: Yoshiyuki Honda, Kanzaki-gun; Akira Koguchi, Maebaru; Eiji Masuda, Tosu, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/195,426

(22) Filed: Nov. 17, 1998

(30) Foreign Application Priority Data

Nov. 18, 1997 (JP) .................................................. 9-333555
Jul. 17, 1998 (JP) ................................................. 10-202611

(51) Int. Cl.⁷ ...................................................... F26B 5/08
(52) U.S. Cl. .................................. 34/317; 34/318; 34/58; 34/186
(58) Field of Search ............................... 34/58, 186, 312, 34/317, 318; 134/902

(56) References Cited

U.S. PATENT DOCUMENTS

| 5,232,328 | * | 8/1993 | Owczarz et al. ...................... 414/222 |
| 5,339,539 | * | 8/1994 | Shiraishi et al. ......................... 34/58 |
| 5,727,332 | * | 3/1998 | Thrasher et al. ....................... 34/277 |
| 5,873,177 | * | 2/1999 | Honda et al. ............................. 34/58 |
| 5,960,562 | * | 10/1999 | Nishida et al. ......................... 34/574 |

FOREIGN PATENT DOCUMENTS

| 5-283392 | 10/1993 | (JP) . |
| 6-9129 | 2/1994 | (JP) . |
| 6-17230 | 3/1994 | (JP) . |
| 6-112186 | 4/1994 | (JP) . |
| 7-22378 | 1/1995 | (JP) . |

* cited by examiner

Primary Examiner—Pamela Wilson
Assistant Examiner—Michelle A Mattera

(57) ABSTRACT

A substrate transporting device and method 19 transports a plurality of wafers W standing upright in a row, from a previous process, i.e., a cleaning process. A substrate holder 40 is carried by a transporting device 50 arranged outside a drying chamber 20. The substrate holder 40 receives the wafers W from the substrate transporting device 19 while maintaining a posture of the wafers W. The transporting device 50 lowers the substrate holder 40 and sequentially moves it into the drying chamber 20 through an unloading and loading port 21 above the drying chamber 20. Thereafter, the substrate holder 40 is fixed to a rotor 30. After closing the unloading and loading port 21 with a lid body 25, the rotor 30 is rotated. In this way, moisture sticking to surfaces of the wafers W is eliminated.

17 Claims, 20 Drawing Sheets

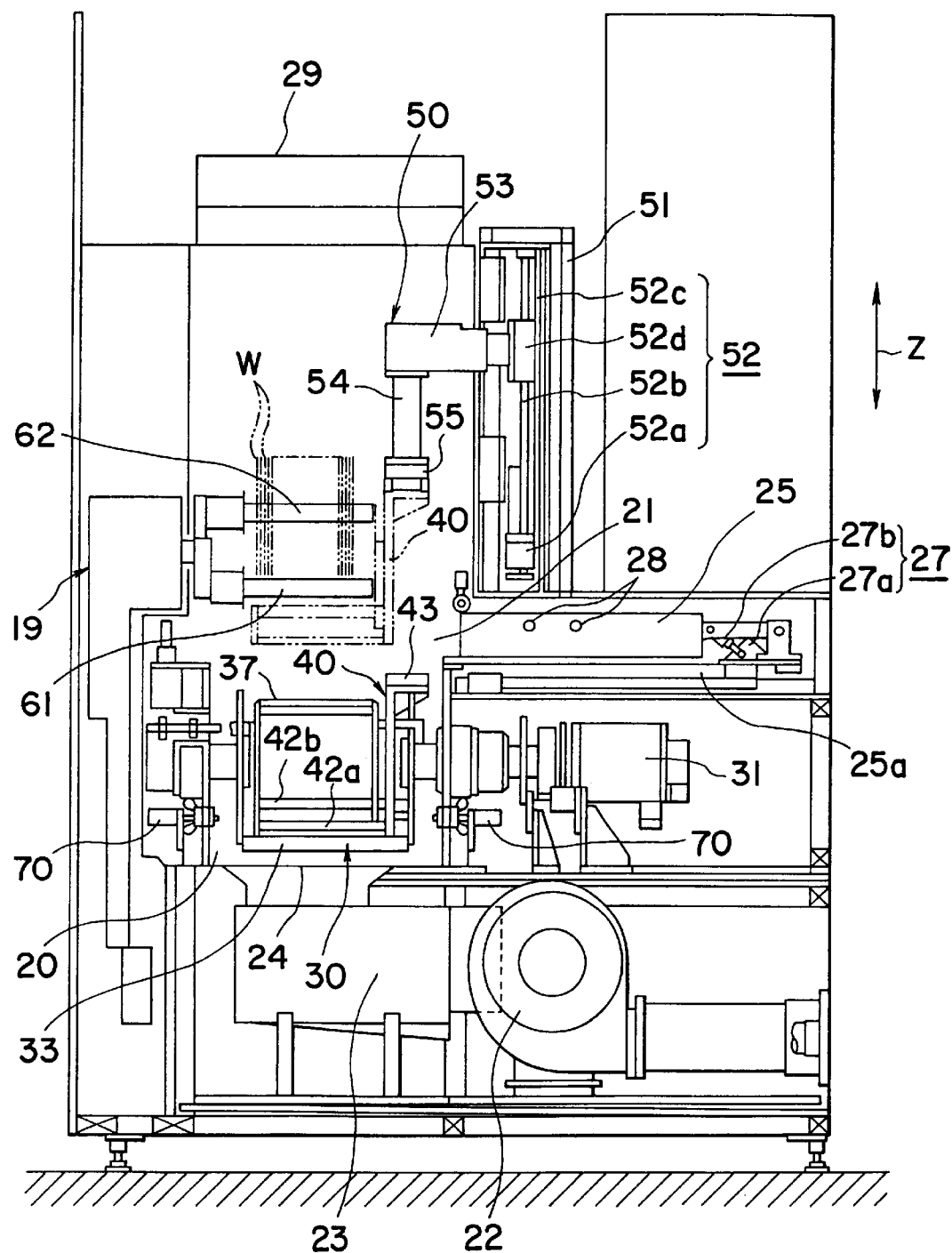
F I G. 2

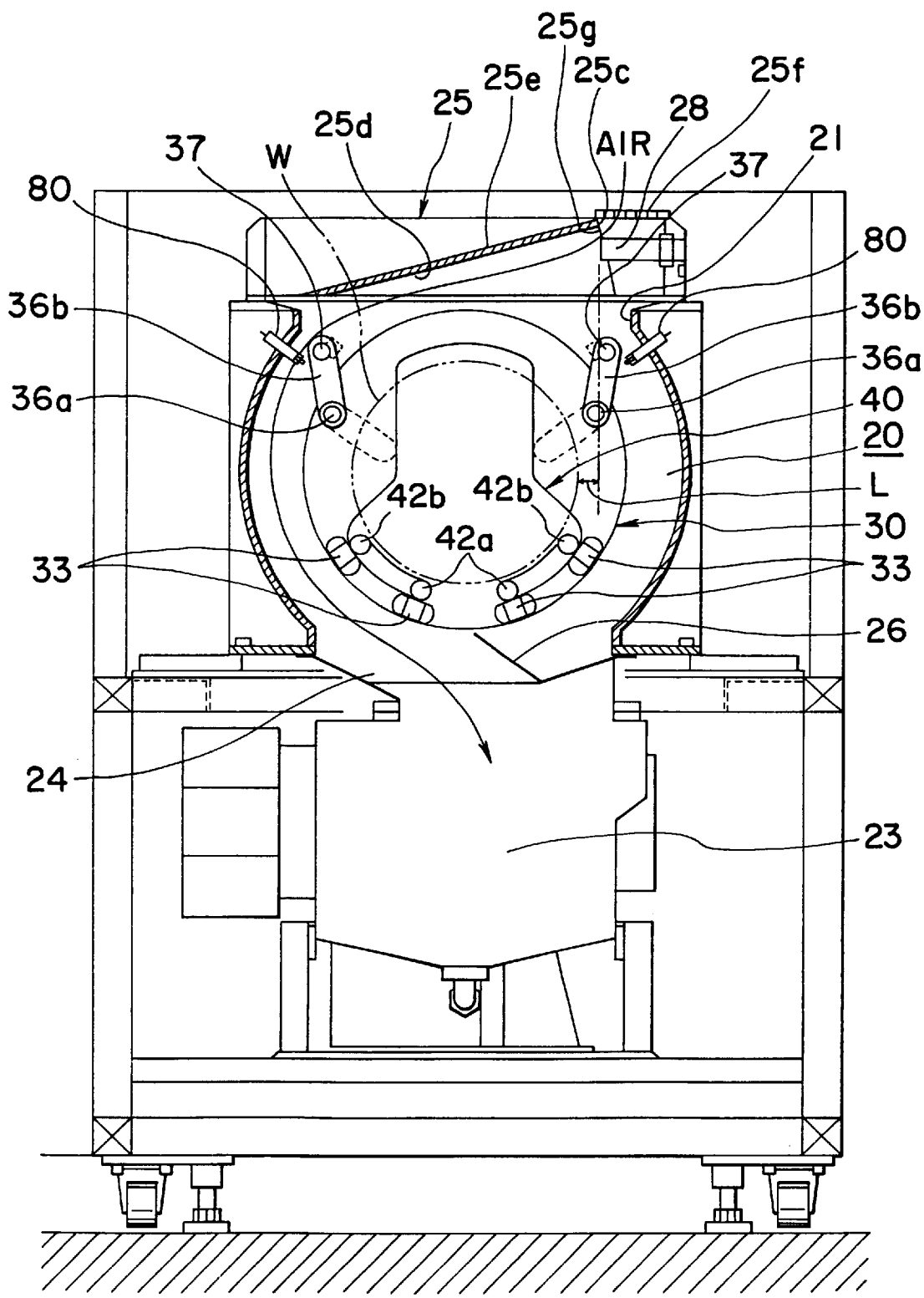
F I G. 3

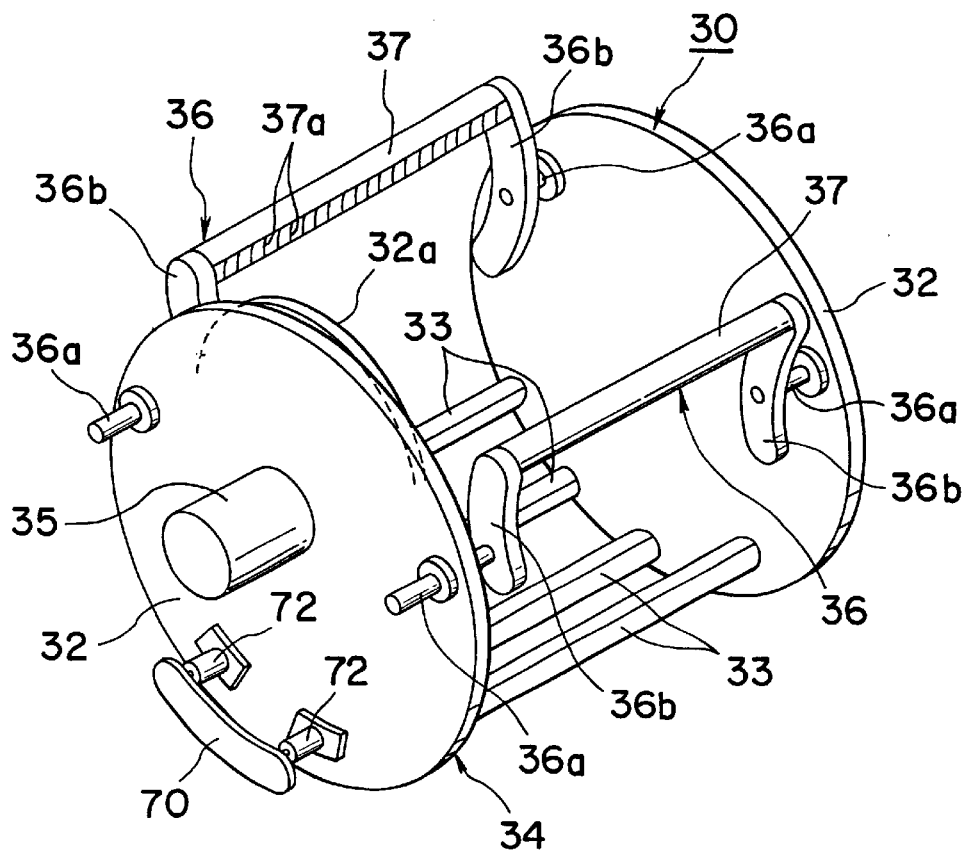
F I G. 6
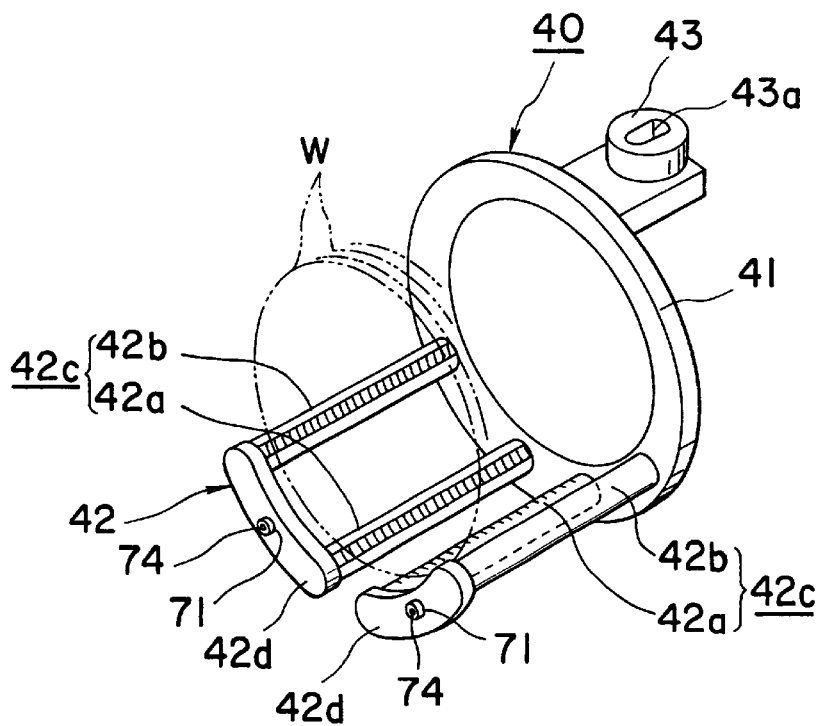
F I G. 7

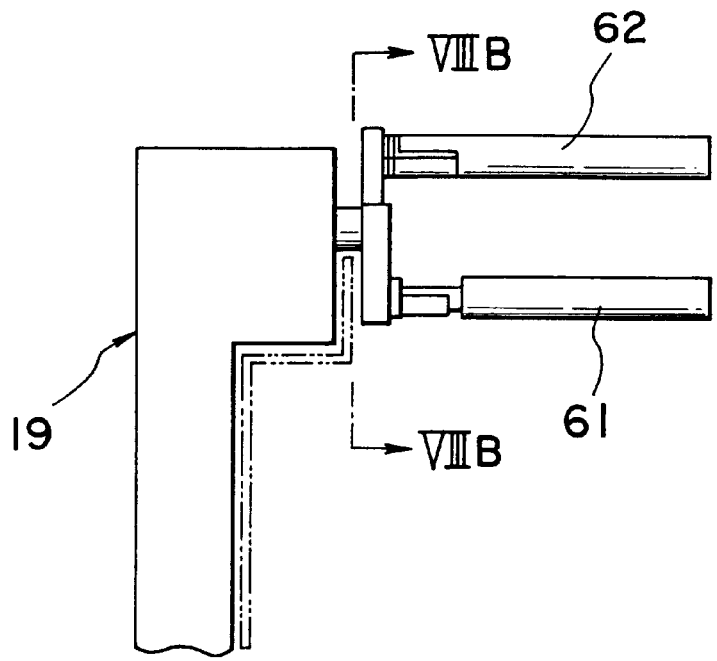
F I G. 8A
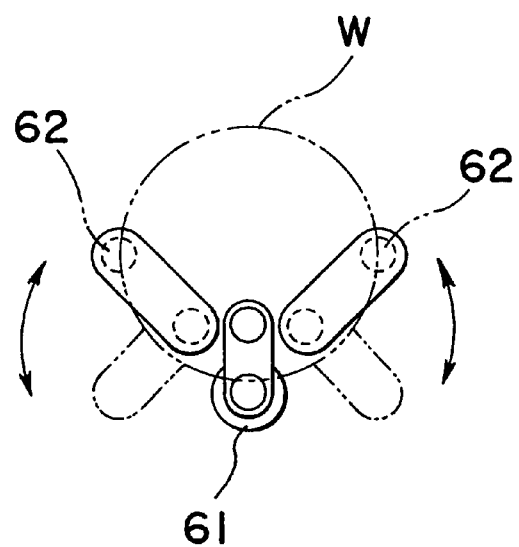
F I G. 8B

METHOD OF DRYING SUBSTRATES AND DRYING APPARATUS

BACKGROUND OF THE INVENTION

1. Field of the Invention

The present invention relates to a drying apparatus for drying substrates to be processed, such as semiconductor wafers and LCD (liquid crystal display) glass substrates etc., and a method of drying the substrates.

2. Description of the Related Art

Generally, in a manufacturing process for producing semiconductor devices, there is a widely adopted cleaning method where the substrates to be processed, such as semiconductor wafers and LCD glass substrates etc. (referred to as "substrates" hereinafter), are successively immersed in a process bath filled up with the chemicals, the rinsing liquids or the like. In a cleaning apparatus realizing the above method, a drying method of dehydrating moisture sticking on the surfaces of the substrates after cleaning and sequentially drying them is widely adopted. Therefore, the cleaning apparatus is equipped with a drying apparatus for realizing the above-mentioned drying method.

In general, as one of the drying apparatuses of this sort, there has been used a so-called "spin dryer" where the moisture sticking on the substrates is eliminated by rotating the plural substrates, which are held so as to stand in a row, round a rotating center parallel with central axes of the substrates.

As the conventional drying apparatuses of this kind, there is known one apparatus employing a structure where the moisture sticking on the surfaces of the substrates is eliminated by rotating a rotor which is disposed in e.g. a drying chamber and to which the plural substrates have been delivered from a transfer arm for holding the substrate standing in a row (see Japanese Unexamined Utility Model Publication Nos. 6-9129 and 6-17230) and another apparatus employing a structure where a substrate holder is detachably installed to the rotor in the drying chamber and also constructed so as to elevate by elevating means arranged below the rotor (see Japanese Unexamined Patent Publication Nos. 5-283392, 6-112186 and 7-22378).

However, the former drying apparatus has problems of not only taking up too much space for its establishment since the apparatus requires to ensure the large volume of the drying chamber for allowing the transfer arm to be inserted into the drying chamber, but lowering the drying efficiency due to a increased clearance between the drying chamber and the rotor.

On the other hand, the latter apparatus has problems that not only the drying chamber is complicated and the apparatus is large-sized, but the opportunities of sticking particles on the substrates are increased with the increased number of times for delivering the substrates.

SUMMARY OF THE INVENTION

Accordingly, it is therefore an object of the present invention to provide a substrate drying apparatus and a substrate drying method, by which it is possible to reduce a capacity of the drying chamber for the compact drying apparatus as possible and improve the drying efficiency. Further, it is an additional object of the present invention to provide a substrate drying apparatus which can reduce the number of times to deliver the substrates, whereby it is possible to reduce opportunities of sticking the particles on the substrates.

In order to attain the above-mentioned object of the present invention, there is provided a drying apparatus for drying substrates to be processed, including: a drying chamber provided, on an upper part thereof, with an unloading and loading port through which the substrates are unloaded and loaded; a substrate holder which retains the substrates in a manner that the substrates stand upright and line up along a horizontal direction; a rotor disposed in the drying chamber so as to rotate about a horizontal rotational axis as a center, the rotor being engageable with the substrate holder; and a substrate holder transporting device arranged outside the drying chamber, the substrate holder transporting device being capable of moving the substrate holder between a delivery position outside the drying chamber, allowing the substrate holder to accept and release the substrates, and an engagement position inside the drying chamber, allowing the substrate holder to engage with the rotor.

According to the second aspect of the present invention, there is also provided a drying apparatus for drying substrates to be processed, including: a drying chamber provided with an unloading and loading port; a substrate holder which retains the substrates in a manner that the substrates stand upright and line up along a horizontal direction; a rotor disposed in the drying chamber so as to rotate about a horizontal rotational axis as a center, the rotor being engageable with the substrate holder; a transporting device for transporting the substrate holder, arranged outside the drying chamber and engageable with the substrate holder, the transporting device being capable of moving the substrate holder between a delivery position outside the drying chamber, allowing the substrate holder to accept and release the substrates, and an engagement position inside the drying chamber, allowing the substrate holder to engage with the rotor; and a substrate transporting device for transporting the substrates, which has been conveyed to the drying apparatus from outside thereof, to the delivery position.

According to the third aspect of the present invention, there is also provided a drying method of drying substrates to be processed, the method including the steps of: delivering the substrates, which are retained in a manner that the substrates stand upright and line up along a horizontal direction by a substrate transporting device, from the substrate transporting device to a substrate holder retained in a transporting device while maintaining a posture of the substrates retained by the substrate transporting device; moving the substrate holder by the transporting device to engage the substrate holder with a rotor in a drying chamber; releasing the substrate holder from the transporting device and withdrawing the transporting device upward; closing the drying chamber with a lid body; and rotating the rotor to eliminate a liquid from respective surfaces of the substrates.

The above and other features and advantages of this invention will become apparent, and the invention itself will best be understood, from a study of the following description and appended claims, with reference had to the attached drawings showing a preferred embodiment of the invention.

BRIEF DESCRIPTION OF THE DRAWINGS

FIG. 2 is a side view of the substrate drying apparatus of the present invention, showing the whole constitution of the apparatus schematically;

FIG. 3 is an enlarged cross sectional view of an essential part in the vicinity of a drying chamber of the substrate drying apparatus of FIG. 2;

FIG. 5A is a plan view of the lid body and the driving mechanism and FIG. 5B is a side view of the lid body and the driving mechanism;

FIG. 6 is a perspective view showing an essential part of a rotor of FIG. 2;

FIG. 7 is a perspective view showing an essential part of a wafer holder of FIG. 2;

FIGS. 8A and 8B show a wafer transfer chuck of FIG. 2: FIG. 8A is a side view of the chuck and FIG. 8B is a cross sectional view taken along a line VIII B—VIII B of FIG. 8A;

FIG. 13A is a plan view of the fixing arrangement; FIG. 13B is a cross sectional view of the fixing arrangement and FIG. 13C is a side view of the fixing arrangement;

FIGS. 21 to 25B are views showing a series of operations of a substrate drying apparatus in accordance with the present invention: FIG. 21 is a schematic cross sectional view showing a condition that the wafers before drying are conveyed onto the substrate drying apparatus; FIG. 25A is a schematic cross sectional view showing a condition to dry the wafers and FIG. 25B is a schematic side cross sectional view of FIG. 25A.

DESCRIPTION OF THE PREFERRED EMBODIMENT

An embodiment of the present invention will be described with reference to drawings, taking an instance of applying a drying apparatus of the invention on to a cleaning system for semiconductor wafers.

Figure 1:
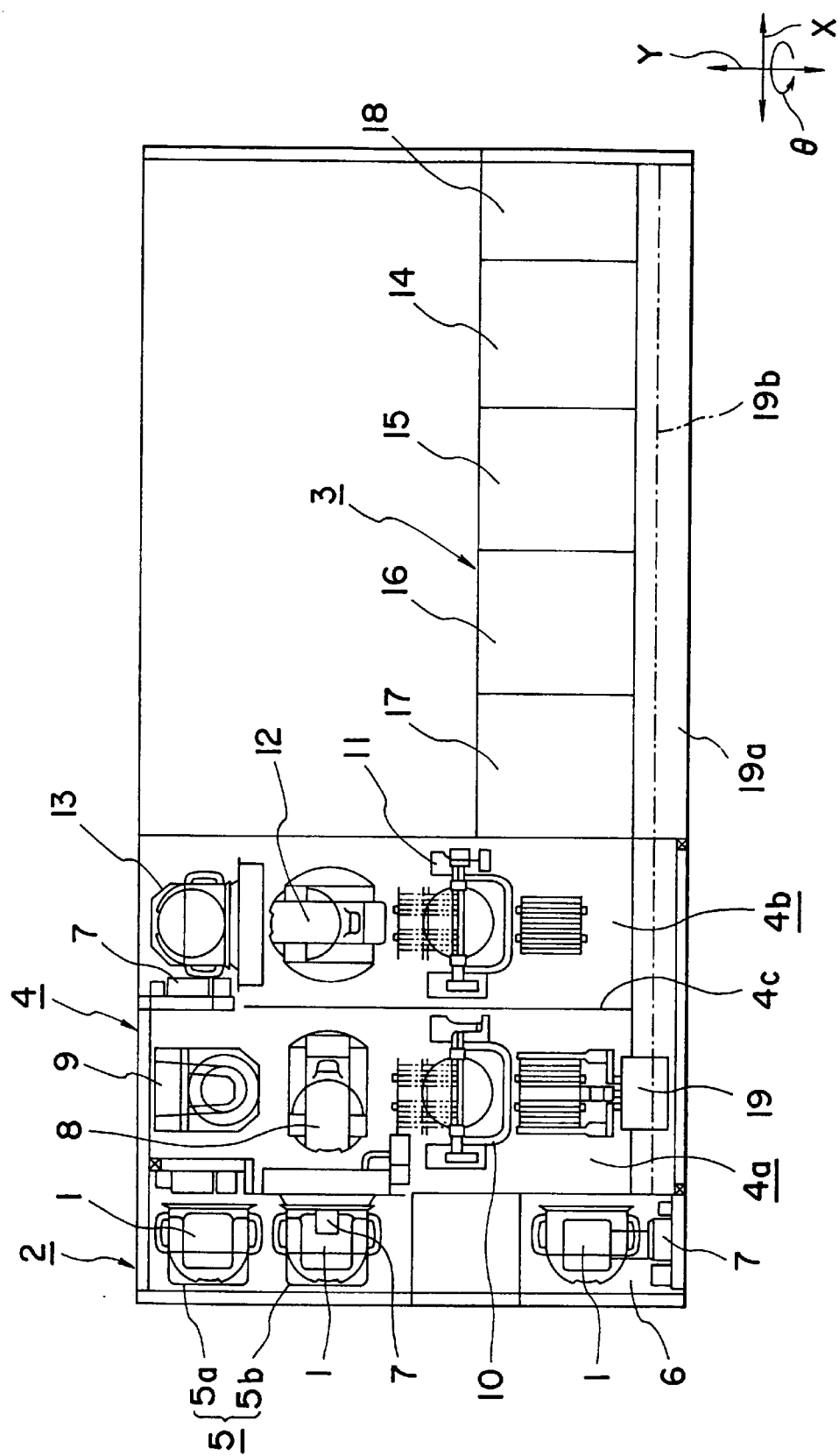
FIG. 1 is a schematic plan view of a cleaning system to which a substrate drying apparatus in accordance with the present invention is applied.

At first, we now describe an overall constitution of the cleaning system. As shown in FIG. 1, the cleaning system mainly comprises: a loading and unloading section 2 for loading and unloading a container for accommodating wafers W horizontally, namely a carrier 1; a processing section 3 for cleaning the wafers W by using chemicals, cleaning liquids etc. and sequentially drying them; and an interface section 4 positioned between the loading and unloading section 2 and the processing section 3, for delivering the wafers W from the section 2 to the section 3 and vice versa, adjusting the position of the wafers W and for changing the posture of the wafers W.

The loading and unloading section 2 is constituted by an input (loading) part 5 and an output (unloading) part 6, both of which are juxtaposed on one side of the cleaning system. In order to load the carriers 1 to the input part 5 and unload them from the output part 6, slide tables (not shown) are respectively provided in a carrier input port 5a and a carrier output port 5b of the input part 5.

Carrier lifters 7 are arranged in the input part 5 and the output part 6, respectively. The carrier lifters 7 not only convey the carriers 1 in the input part 5 and the output part 6, but deliver the vacant carriers 1 between the loading and unloading section 2 and a carrier stand-by part (not shown) arranged above the section 2.

The processing section 3 includes the following units aligned in a row: a first processing unit 14 for eliminating particles and organic contaminants adhering to the wafers W; a second processing unit 15 for eliminating metallic contaminants adhering to the wafers W; a third processing unit 16 for eliminating oxidation films formed on the wafers W; a drying unit for eliminating the moisture, such as the cleaning liquid sticking on the wafers W, and drying them, that is, a substrate drying apparatus 17; and a chuck cleaning unit 18 for cleaning a wafer transport chuck 19 which will be described later.

Disposed on a transport path 19a opposing these units 14–18 is a substrate transporting apparatus, i.e. the wafer transport chuck 19 which can move along directions of X and Y (horizontal), a direction of Z (vertical) and also a rotating direction (θ). The transport path 19a is arranged beside the drying chamber 20. On the transport path 19a, a guide rail 19b is laid to guide the moving wafer transport chuck 19. Being driven by not-shown drive means, the wafer transport chuck 19 is capable of conveying the wafers W among the respective units 14–18 in the processing section 3 and also between the section 3 and the interface section 4.

Skipping to FIG. 8A, the wafer transport chuck 19 includes a fixed retaining rod 61 for supporting respective lowermost portions of the plural wafers W standing in a row and a pair of movable retaining rods 62 for supporting respective side portions of the wafers W. Each movable retaining rod 62 is pivotally movable about a horizontal rotating axis, which is located in the vicinity of the fixed retaining rod 61. Each of the fixed retaining rod 61 and the movable retaining rods 62 has a number of grooves (not shown) formed at regular intervals in the axial direction, for retaining the wafers W.

As shown with solid lines in FIG. 8B, by the upward rotation of the movable retaining rods 62, the wafer transport chuck 19 is capable of retaining the wafers W at three points composed of the fixed retaining rod 61 and the movable retaining rods 62.

Returning to FIG. 1, the interface section 4 is divided by a partition wall 4c into a first chamber 4a adjacent to the input part 5 and a second chamber 4b adjacent to the output part 6. In the first chamber 4a, the interface section 4 includes: a wafer pick-up arm 8 for picking up the wafers W from the carriers 1 in the input part 5 for transportation, the wafer pick-up arm 8 being capable of moving in the horizontal directions (X, Y), the vertical direction (Z) and the rotating direction (θ); a notch aligner 9 which detects notches formed on the wafers W, for lining them up; and a clearance adjusting mechanism (not shown) for adjusting each clearance between the adjoining wafers W picked up by the wafer pick-up arm 8. Additionally, a first posture changing device 10 is also arranged in the first chamber 4a, for bringing the wafers W from their horizontal arrangement into the vertical arrangement.

In the second chamber 4b, the interface section 4 includes: a second posture changing device 11 for changing the posture of the wafers W from the vertical arrangement to the horizontal arrangement on receipt of the processed wafers W which have been conveyed from the processing section 3 by the wafer transport chuck 19; and a wafer accommodating arm 12 for receiving the wafers W, of which postures have been changed to the horizontal arrangement by the second posture changing device 11, and sequentially accommodating the wafers W into the empty carrier 1 conveyed to a wafer receiving part 13, the wafer accommodating arm 12 being also capable of moving in the horizontal directions (X, Y), the vertical direction (Z) and the rotating direction (θ).

With reference to FIGS. 2 to 25B, we describe the substrate drying apparatus 17 of the present invention. Essentially, the substrate drying apparatus 17 includes: a drying chamber 20; a horizontal shaft type rotor 30 arranged in the drying chamber 20; a wafer holder 40 (substrate holder) which is engageable and disengageable with the rotor 30; and a wafer guide 50 (i.e. a device for transporting the substrate holder) which is engageable and disengageable with the wafer holder 40, for transporting it up and down.

These constituents of the drying apparatus 17 will be described hereinafter.

First, we now describe the drying chamber 20. As shown in FIGS. 2 and 3, the drying chamber 20 is provided, at an upper part thereof, with a loading and unloading port 21 for loading and unloading the substrates, i.e. the semiconductor wafers W in and from the drying chamber 20. A lid body 25 is also provided for closing the port 21.

On the other hand, the drying chamber 20 is provided, at a lower part thereof, with an exhaust port 24 to which an exhaust pipe 23 is connected. In the exhaust pipe 23, an exhaust fan 22 is arranged. The rotor 30 is arranged in the drying chamber 20.

As shown in FIG. 3, sidewalls defining the drying chamber 20 are profiled so as to form substantially cylindrical surfaces. In the vicinity of the exhaust port 24, a counterflow preventive plate 26 is provided for preventing the exhaust air from flowing backward to the drying chamber 20.

Figure 4:
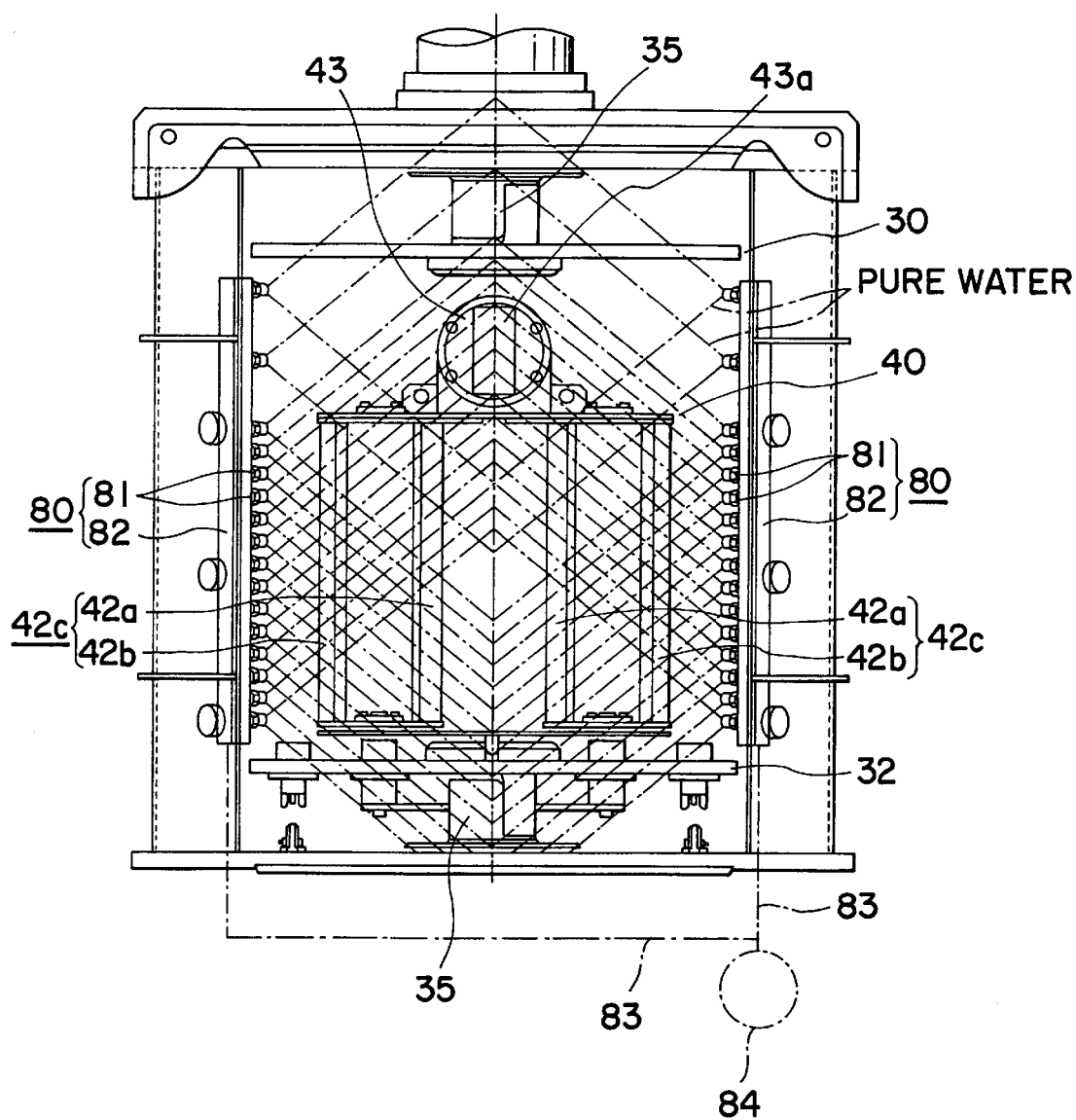
FIG. 4 is a schematic plan view of the drying chamber of the substrate drying apparatus of FIG. 3, viewed from an unloading and loading port of the drying chamber.

As shown in FIGS. 3 and 4, a pair of nozzle units 80 are arranged close to the loading and unloading port 21 of the drying chamber 20, for ejecting the cleaning liquid (pure water) toward the whole area of the rotor 30 from the upside. Each of the nozzle units 80 is constituted by a liquid supply tube 82 and a plurality of nozzles 81 (16 pieces in this embodiment) which are disposed at appropriate intervals in the longitudinal direction of the tube 82, for ejecting the cleaning liquid. The liquid supply tubes 82 are respectively connected to a liquid supply source 84 through the intermediary of pipes 83. By using the nozzle units 80, it is possible to effectively clean the rotor 30, the wafer holder 40 having no wafers W and the inside walls of the drying chamber 20 after completing one drying process. Note, by ejecting the pure water from the nozzles 81 toward the wafers W while attaching the wafer holder 40 retaining the wafers W to the rotor 30, it is also possible to carry out the cleaning process of the wafers W.

Figures 5A, 5B:
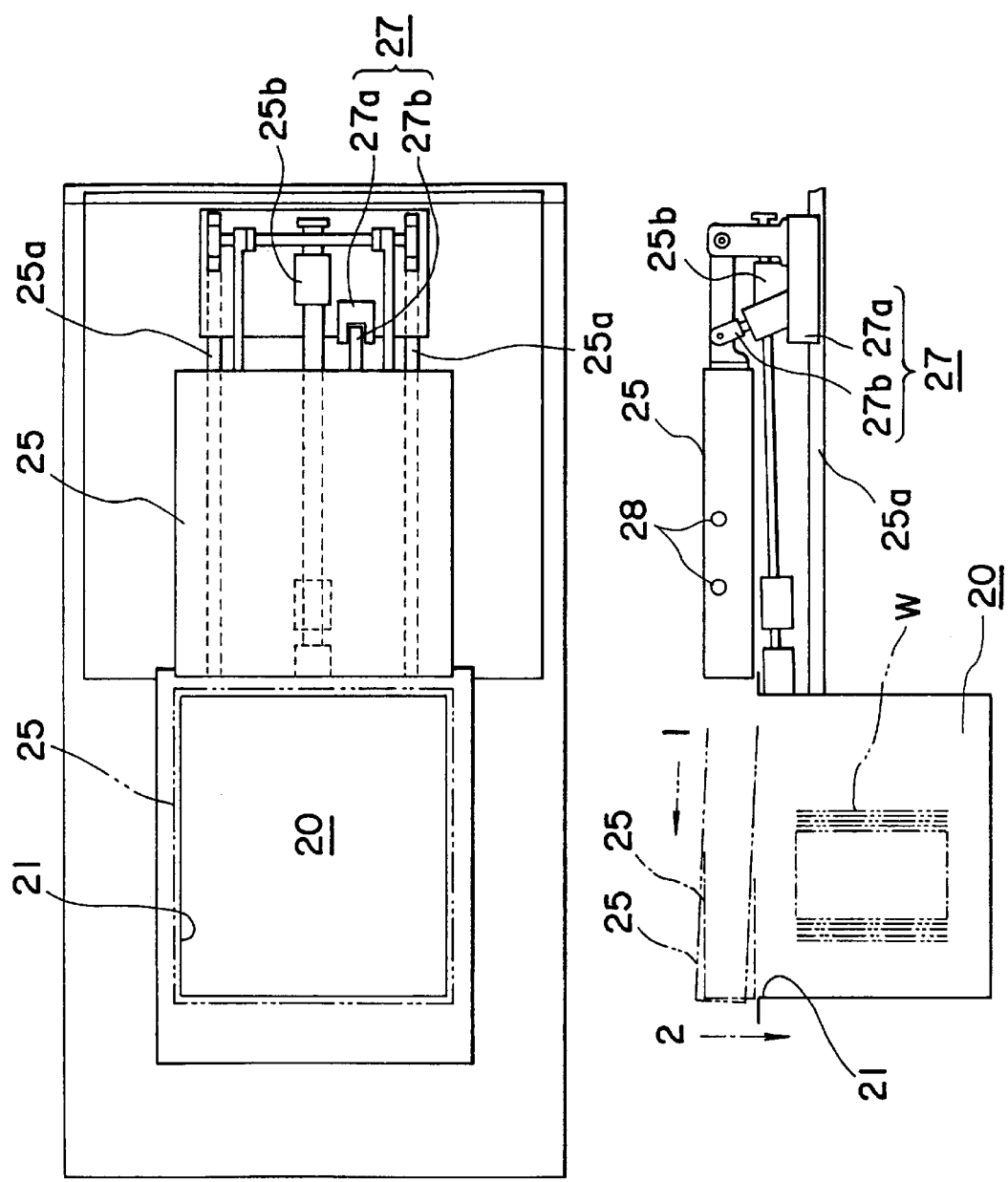
FIGS. 5A and 5B show a lid body and a driving mechanism for the lid body schematically.
Figure 9:
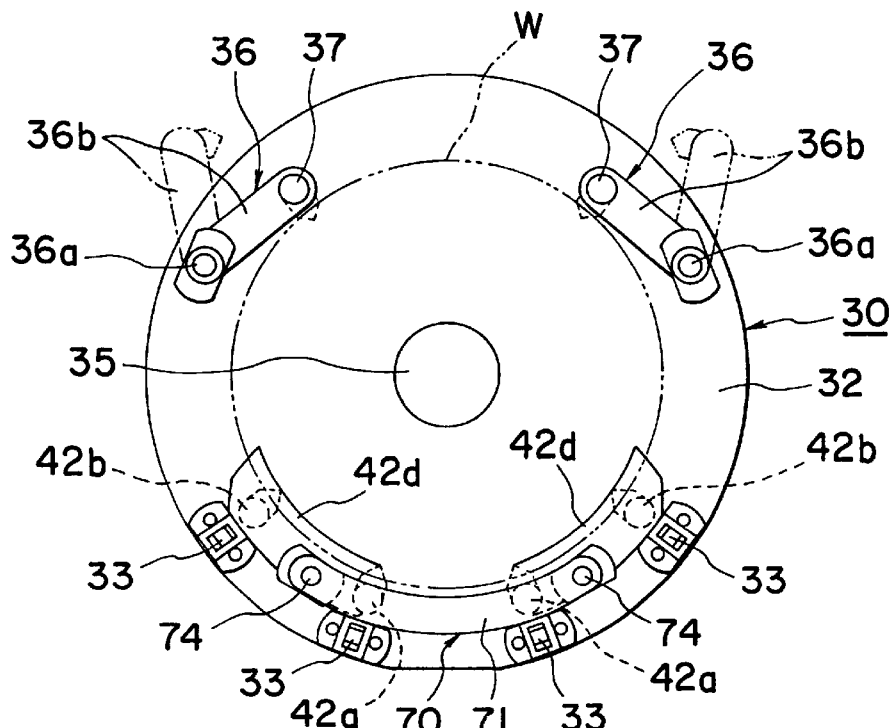
FIG. 9 is a side view of respective essential parts of a wafer pusher mechanism, a rotor and a locking mechanism of the wafer holder.

As shown in FIGS. 3, 5A and 5B, the lid body 25 is slidably mounted on a pair of guide rails 25a laid beside the loading and unloading port 21. Being horizontally moved by the expansion of a rod-less cylinder 25b, the lid body 25 is capable of opening and closing the loading and unloading port 21. Further, the lid body 25 is connected to a piston rod 27b of a pneumatic cylinder 27a. When the lid body 25 closes the loading and unloading port 21, the lid body 25 is drawn toward the loading and unloading port 21 by a shrinkage of the piston rod 27b, so that the lid body 25 can come into tight contact with the port 21.

As particularly shown in FIG. 3, the lid body 25 has an air inlet 25c positioned on one side of an upper portion of the drying chamber 20. The lid body 25 further includes an inner face 25d facing the interior of the drying chamber 20. The inner face 25d is slanted to a horizontal plane. The inner face 25d is arranged so as to define a downward pitch from an opening of the air inlet 25c toward the other side of the upper portion of the drying chamber 20. When driving the exhaust fan 22, the air is introduced into the drying chamber 20 through the air inlet 25, while the air is discharged through the exhaust port 24 (see an arrow of FIG. 3).

An edge 25g of the inner face 25d of the lid body 25 on the side of the air inlet 25c is positioned horizontally outside the peripheries of the wafers W held by the wafer holder 40 engaging with the rotor 30, by an appropriate distance L (see FIG. 3). Therefore, even if a waterdrop etc. sticks to the edge 25g of the lid body 25 and falls due to the full-grown waterdrop's own weight, it will drop outside the wafers W. Thus, it is possible to prevent the wafers W from being contaminated by the waterdrops sticking thereon.

The inner face 25d of the lid body 25 is coated with a PTFE (polytetrafluoroethylene) film 25e exhibiting corrosion resistance and water repellent characteristics. Thus, it is possible to prevent the waterdrops from adhering to the lid body 25, so that the corrosion of the lid body 25 can be avoided.

At the air inlet 25c, a straightening plate 25f of stainless steel is provided with a number of orifices at appropriate intervals. The straightening plate 25f straightens the air flow introduced through the air inlet 25c to reduce the unevenness in air flow, thereby contributing the improvement of drying efficiency.

An ionizer 28 is disposed below the straightening plate 25f of the air inlet 25. The ionizer 28 irradiates an ion against the air introduced into the drying chamber 20 to remove an electrical charge and also interrupts the generation of static electricities. Note, above the drying chamber 20, a filter fan unit 29 is provided to supply the cleaned air into the drying chamber 20 (see FIG. 2).

Next, we describe the constitution of the rotor 30. As shown in FIG. 6, the rotor 30 includes a rotor base 34 consisting of a pair of circular discs 32, a plurality (e.g. 4 pcs.) of connecting rods 33 connecting respective lower portions of the circular discs 32 with each other. At a center of each circular disc 32, a rotational shaft 35 is formed so as to project from the disc 32. The rotor 30 is accommodated horizontally in the drying chamber 20 through the intermediary of the rotational shafts 35. One of the rotational shafts 35 of the rotor 30 is connected with a motor 31 (FIG. 2) arranged outside the drying chamber 20, so that the driving of the motor 31 allows the rotor 30 to be rotated about a horizontal axis as a rotational center. A windbreak plate 32a is provided inside the other circular plate 32.

Additionally, the rotor 30 is provided with a retaining arm 36 for holding down respective top portions of the wafers W retained by the wafer holder 40 attached to the rotor 30. As shown in FIGS. 3 and 6, the retaining arm 36 includes two pairs of rotational arms 36b pivoted on respective upper portions of the circular discs 32 through pivot shafts 36a respectively and cross beams 37 as retaining elements, each of which extends between the opposing rotational arms 36b. The respective cross beams 37 are made of PTFE resin, extending horizontally. Each cross beam 37 has a plurality of V-shaped grooves 37a formed along the longitudinal direction of the beam 37.

Figure 10:
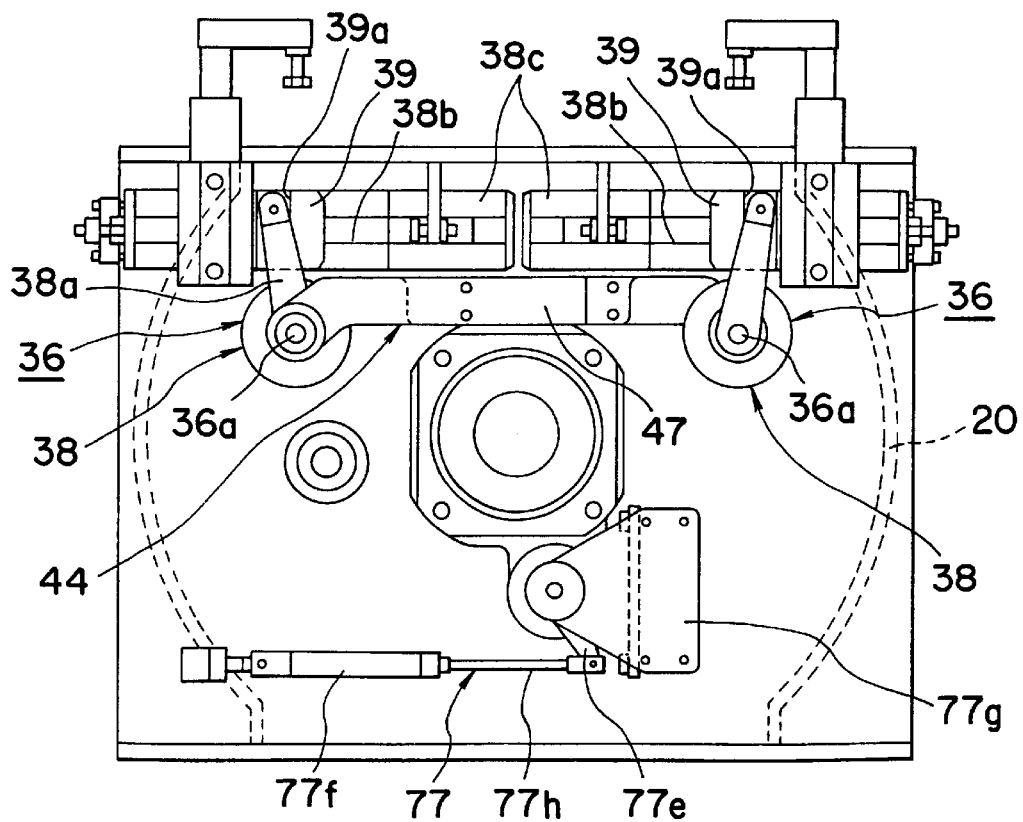
FIG. 10 is a side view of the essential part of the wafer pressing mechanism of FIG. 9.

The drying apparatus of the invention is provided with a pair of retaining arm actuating mechanisms 38 for respectively rotating the rotational arms 36b of the circular disc 32 on one side, thereby actuating the retaining arms 36. As shown in FIG. 10, each of the actuating mechanism 38 is constituted by a swing link 38a provided on an outer wall of the drying chamber 20 and detachably linked to the pivot shaft 36a, and a cylinder 38c and a sliding element 39 both of which serve to swing the swing link 38a. A free end of the swing link 38a is slidably inserted into a vertical groove 39a formed in the sliding element 39. With the arrangement, each sliding element 39 can be horizontally moved by actuating the cylinder 38c, so that the swing link 38a does swing. Consequently, the pivot shaft 36 and the rotational arm 36b are rotated to move each cross beam 37 on the free end of the rotational arm 36b from a position shown with a two-dot chain line of FIG. 9 to another position shown with a solid line of the figure. In this way, it is possible to hold down the top portions of the wafers W retained in the wafer holder 40.

Figure 13A:
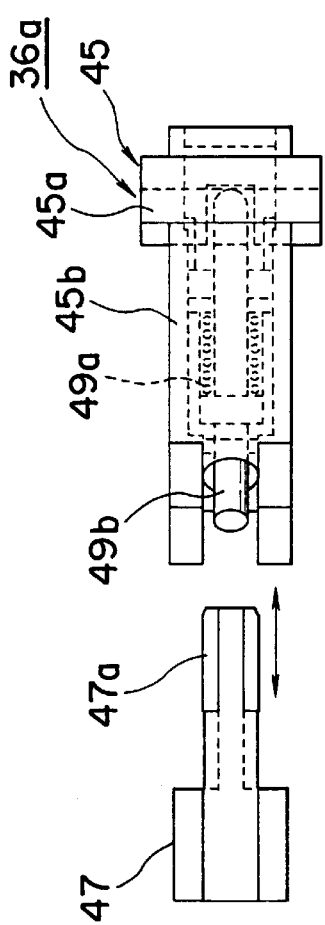
FIGS. 13A, 13B and 13C show a fixing arrangement of a wafer pusher mechanism.
Figure 13B:
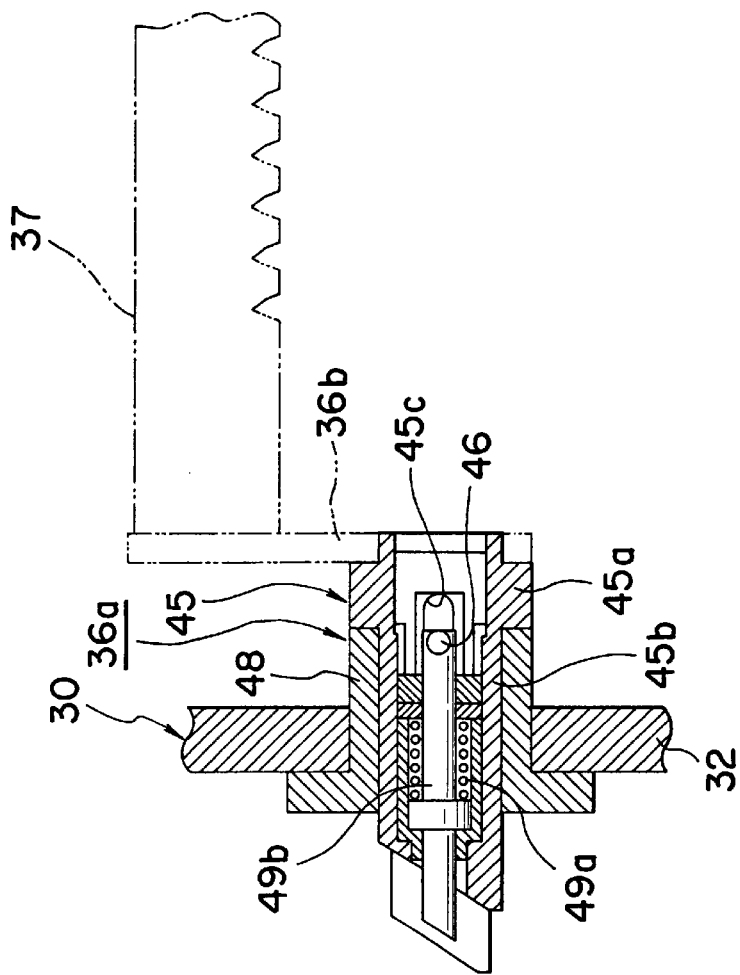
Figure 13C:
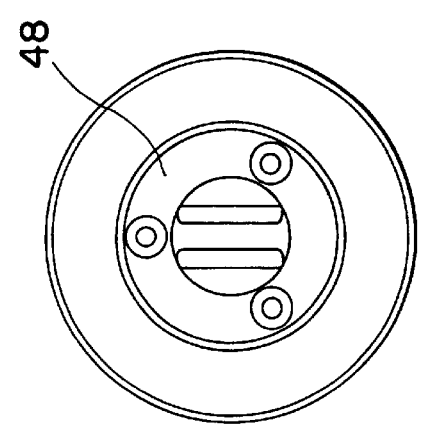
Figure 14A:
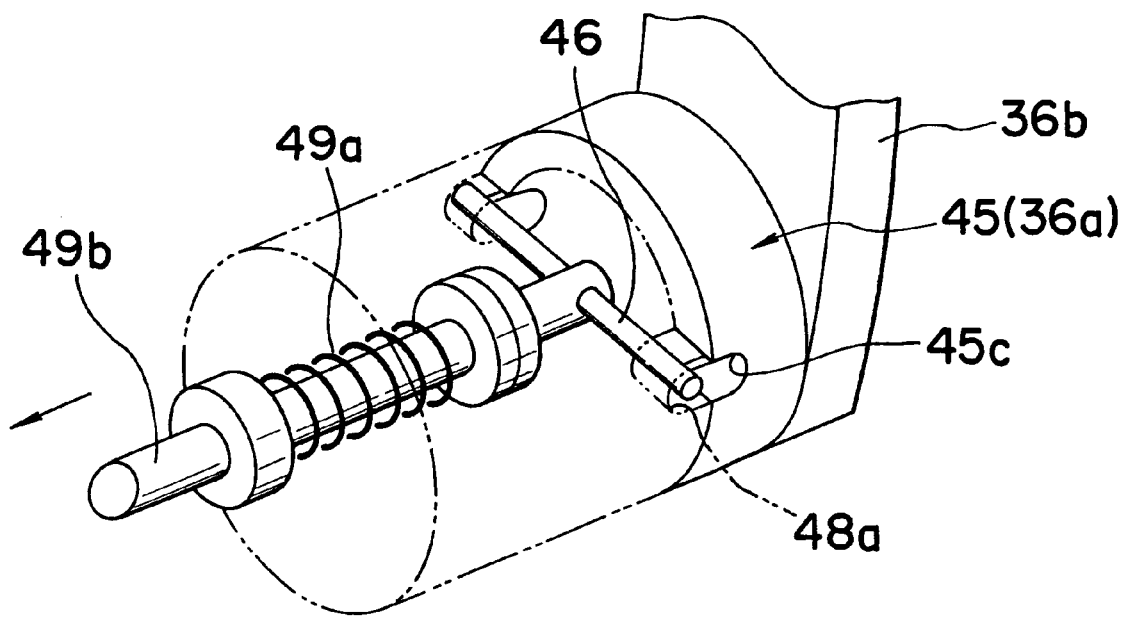
FIG. 14A is a perspective view showing the fixing arrangement under its locked condition schematically and FIG. 14B is a perspective view showing an essential part of a stepped cylinder constituting the fixing arrangement partially.
Figure 14B:
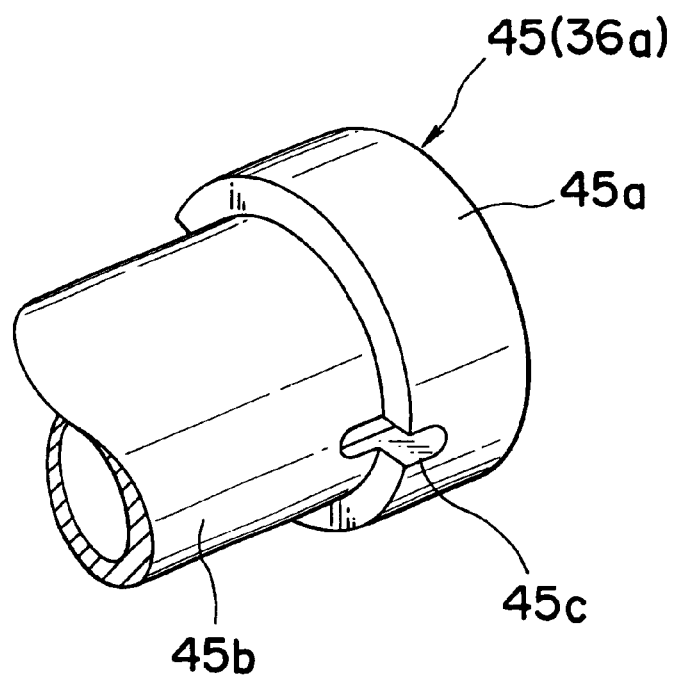
Figure 15A:
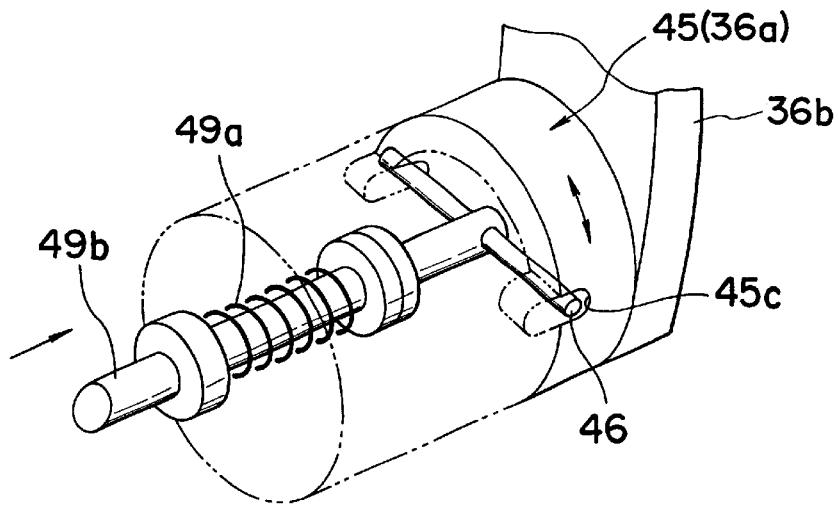
FIGS. 15A and 15B are schematic perspective views showing another form of a condition that the fixing arrangement is released.
Figure 15B:
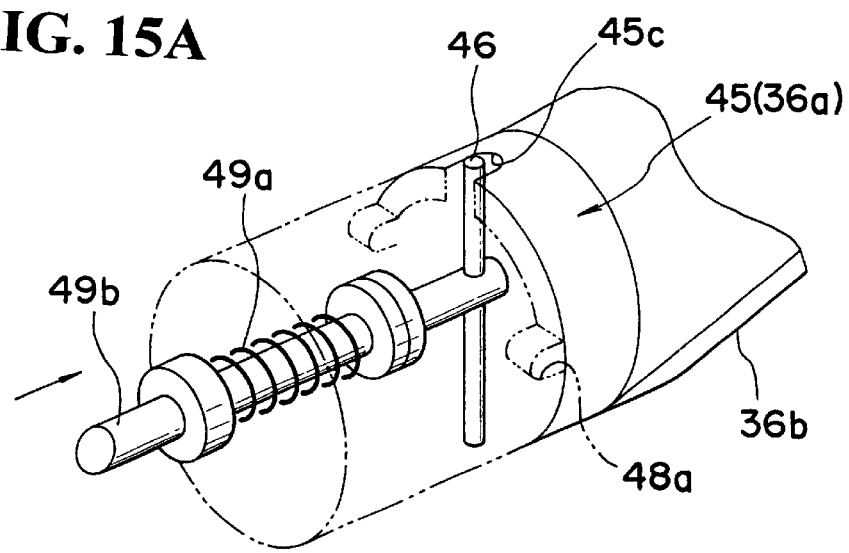

Further, the drying apparatus of the invention includes a fixing mechanism 44 for keeping the retaining arm 36 holding down the top portions of the wafers W. As shown in FIGS. 13A–13C, the fixing mechanism 44 includes a cylindrical-shaped and stepped receiving member 45 constituting the pivot shaft 36a, an engagement member 46 which is approachable to and separable from the receiving member 45 and an actuating cylinder 47 for moving the engagement member 46 for engagement and disengagement with the receiving member 45.

The receiving member 45, that is, the pivot shaft 36a is composed of a large diametrical part 45a projecting from the circular disc 32 of the rotor 30 and a small diametrical part 45b. The small diametrical part 45b of the receiving member 45, namely, a stepped cylinder 45 is rotatably inserted into a bushing 48 which is fixed to the circular disc 32 of the rotor 30 and which has the same diameter as that of the large diametrical part 45a.

At the stepped part of the stepped cylinder 45, receiving grooves 45c in the form of elongated holes are arranged at two positions opposing to each other. Similarly, the bushing 48 is also provided, at two opposing positions at a tip thereof, with concave grooves 48a. The positions of the receiving grooves 45c coincide with the positions of the concave grooves 48a, respectively.

An operating spindle 49b is slidably inserted into the stepped cylinder 45. At the tip of the operating spindle 49b, the engagement member 46 is arranged so as to intersect with the operating spindle 49b. The operating spindle 49b is normally urged to the direction apart from the receiving member 45 by a spring 49a. Therefore, the engagement member 46 is usually engaged into the receiving grooves 45c on the side of the small diametrical part 45b and the concave grooves 48a of the bushing 48 by the force of repulsion of the spring 48a (see FIGS. 13 and 14). Under this condition, since the engagement member 46 engages with the bushing 48 secured on the circular disc 32 of the rotor 30, the retaining arm 37 is locked while holding down the top portions of the wafers W.

When driving the actuating cylinder 47 to stretch the piston rod 47a, the operating spindle 49b is moved in opposition to the repulsing force of the spring 49a. Then, the engagement member 46 is pushed out of the concave grooves 48a of the bushing 48 and shifted into the receiving grooves 45c of the side of the large diametrical part 45a of the stepped cylinder 45. Thus, the retaining arm 37 is delocked for its rotation (see FIGS. 15A–15B). By driving the cylinder 38 under such a situation, it is possible to withdraw the retaining arm 36.

Figure 16:
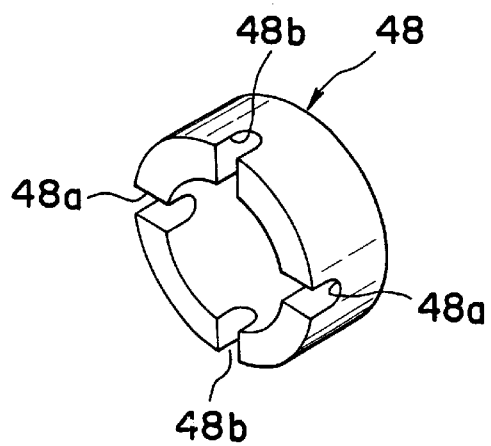
FIG. 16 is a perspective view showing another form of a bushing on the rotor's side as a constituent of the fixing arrangement.

Note, as shown in FIG. 16, by providing the bushing 48 with concave grooves 48b for inserting the released engagement member 46, it is also possible to prevent the engagement member 46 from undesirable moving, thereby being more safe.

Figure 11:
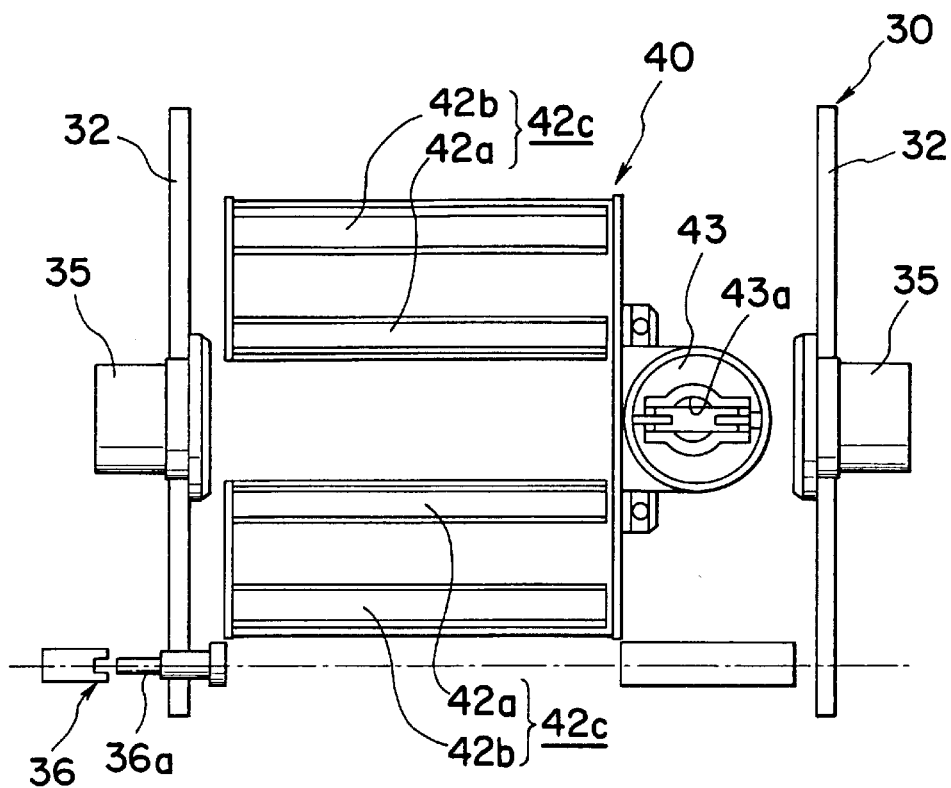
FIG. 11 is a plan view showing a condition where the wafer holder is engaged with the rotor schematically.
Figure 12:
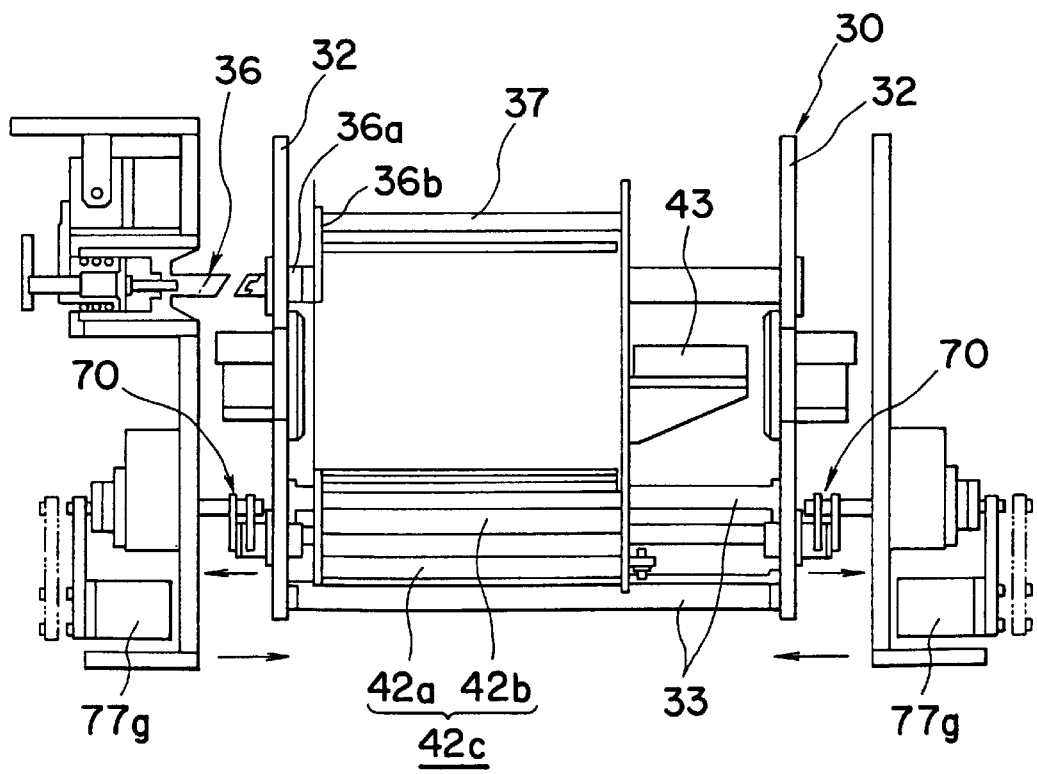
FIG. 12 is a side view showing the condition where the wafer holder is engaged with the rotor schematically.

The wafer holder 40 will be described as follows. As shown in FIG. 7, the wafer holder 40 includes an upright annular baseplate 41 and a wafer support 42 arranged on a lower part of one side face of the baseplate 41. Further provided on an upper part of the other side face of the baseplate 41 is an engagement part 43 which detachably engages with the wafer guide 50. Note, the baseplate 41 may take a form of a disk, and the engagement part 43 may be placed on the center of the baseplate 41, as shown in FIGS. 11 and 12.

The wafer support 42 is constituted by a pair of support arms 42c symmetrically arranged on the side face of the baseplate 41. Each of the support arms 42c includes a lower supporting rod 42a and a side supporting rod 42b projecting from the baseplate 41 horizontally and a fixed plate 42d connected with respective ends of the lower supporting rod 42a and the side supporting rod 42b.

Each lower supporting rod 42a has a plurality of general V-shaped grooves formed at predetermined pitches, while each side supporting rod 42b has a plurality of general Y-shaped grooves formed at regular intervals each equal to each of the predetermined pitches. Hereat, the reason why each groove of the lower supporting rods 42a is general V-shaped is for the purpose of supporting the weight of the wafers W by the V-shaped grooves. On the other hand, the reason why each groove of the side supporting rods 42b is general Y-shaped is for the purpose of preventing the wafers W on the lower supporting rods 42a from being slanted. Owing to the provision of the V-shaped grooves and the Y-shaped grooves, the wafer holder 40 is capable of holding the plural wafers W in an upright manner with the wafers W being aligned in a horizontal direction.

Next, we describe a mechanism (referred to as "the locking mechanism 70", hereinafter) for fixing the wafer holder 40 to the rotor 30. As especially shown in FIG. 18, a receiving bush 71 is fitted to the fixed plate 42d of the wafer holder 40. Note, another receiving bush 71 is fitted to the annular baseplate 41, too. Thus, the locking mechanism 70 is provided, on both sides of the rotor 30, with the identical bushes 71.

The locking mechanism 70 includes a guide cylinder 72 penetrating through the circular disc 32 of the rotor 30, a lock pin 73 slidably inserted into the guide cylinder 72 and a spring 75. The spring 75 is disposed between a flange part 73a on the lock pin 73 and an inner flange part 72a on the end of the guide cylinder 72. The spring 75 urges the lock pin 73 so that it is always inserted into an engagement hole 74 of the bush 71 on the fixed plate 42d. With the engagement of the lock pin 73 with the bush 71, the wafer holder 40 is locked on the wafer holder 40.

The locking mechanism 70 includes a mechanism for breaking the engagement of the lock pin 73 with the bush 71, which will be referred "a unlocking mechanism 77", hereinafter. The unlocking mechanism 77 will be described as follows. As shown in FIG. 18, a brim 76 is fastened on one end of the lock pin 73 opposite to the other end for engagement with the bush 71, with a bolt. As shown in FIGS. 10, 12, 17 and 18, the unlocking mechanism 77 is constituted by a unlocking plate 77a detachably engaged with the brim 76 as the unlocking member; a manipulating shaft 77b connected with the plate 77a to move it in the rotational and axial directions; a cylinder 77f which expands and contract to rotate the manipulating shaft 77b and the plate 77a; and a unlocking cylinder 77g for moving the manipulating shaft 77b and the plate 77a. The cylinder 77f is connected to a cylindrical body 77d through a link 77e. The manipulating shaft 77b is slidably inserted into the cylindrical body 77d through a bearing 77c.

Figure 17:
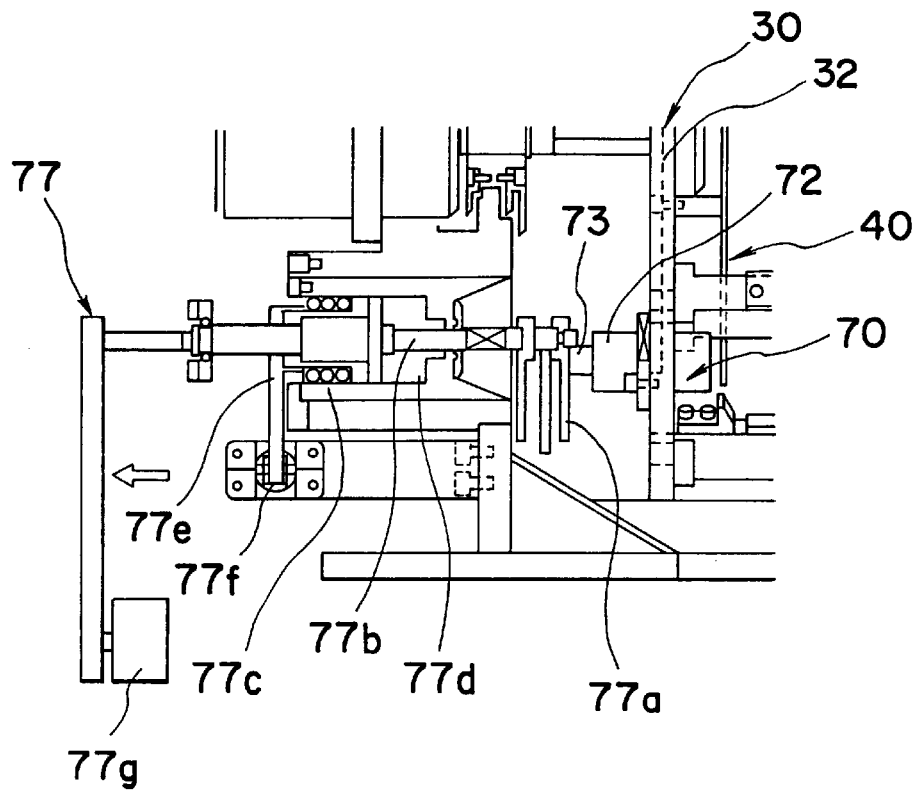
FIG. 17 is a schematic side view of a locking mechanism for the rotor and the wafer holder.
Figure 18:
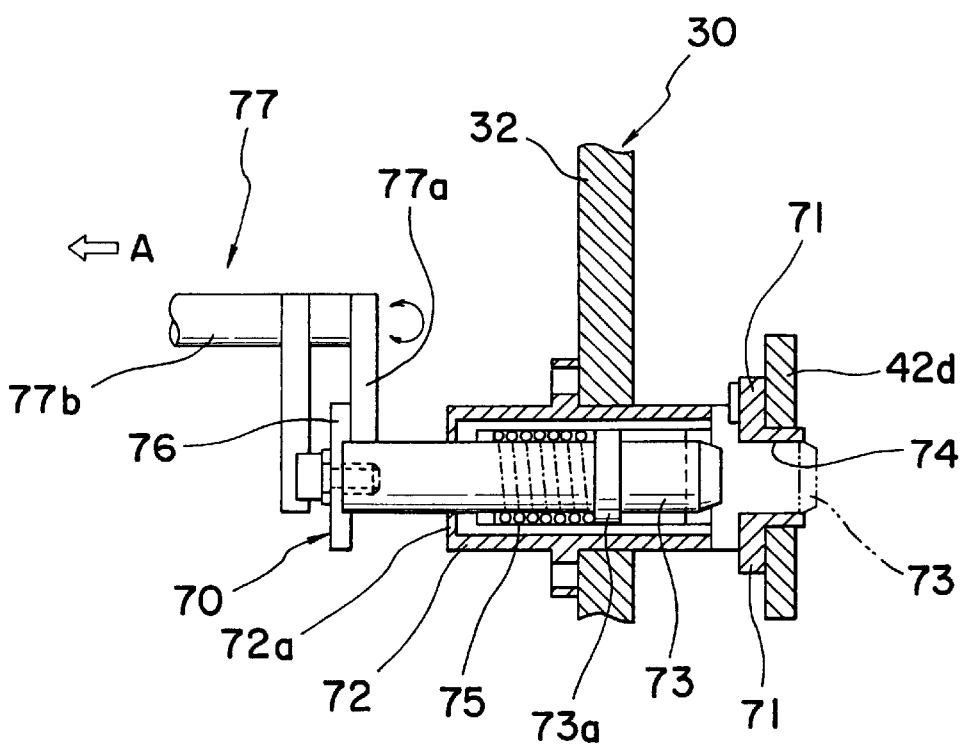
FIG. 18 is a schematic side view showing the locking mechanism and a unlocking mechanism partially.

Referring to FIGS. 17 and 18 in particular, we describe the operation of the unlocking mechanism 77. As mentioned before, under condition that the wafer holder 40 is locking with the rotor 30, the lock plate 77a is withdrawn to a position for disengagement with the lock pin 73. In order to break such a locking condition, a piston rod 77 of the cylinder 77f is firstly shrunk to engage the plate 77a with the brim 76.

Next, by actuating the unlocking cylinder 77g for expansion, the manipulating shaft 77b and the plate 77a are moved in the direction of arrow A (see FIGS. 17 and 18). Thus, the brim 76 and the lock pin 73 are moved in opposition to the repulsion of the spring 75 to break the engagement of the lock pin 73 with the engagement hole 74. In this way, the locking condition between the rotor 30 and the wafer holder 40 can be removed.

The wafer guide 50 will be described hereinafter.

As shown in FIG. 2, the wafer guide 50 includes a support bracket 53 which is movable in the vertical direction and a cylindrical carrier member 54 which is suspended from an underside portion of an end of the bracket 53. The support bracket 53 is vertically moved by a ball screw mechanism 52 accommodated in a casing 51 standing besides the opening of the drying chamber 20.

The ball screw mechanism 52 includes a ball screw shaft 52b standing upright in the casing 51 and a sliding element 52d in thread engagement with the ball screw shaft 52b. The ball screw shaft 52b is rotated by a reversible motor 52a. Further, the sliding element 52d is adapted so as to slide along a guide rail 52c in parallel with the ball screw shaft 52b. The sliding element 52d is connected with the support bracket 53.

Figure 19A:
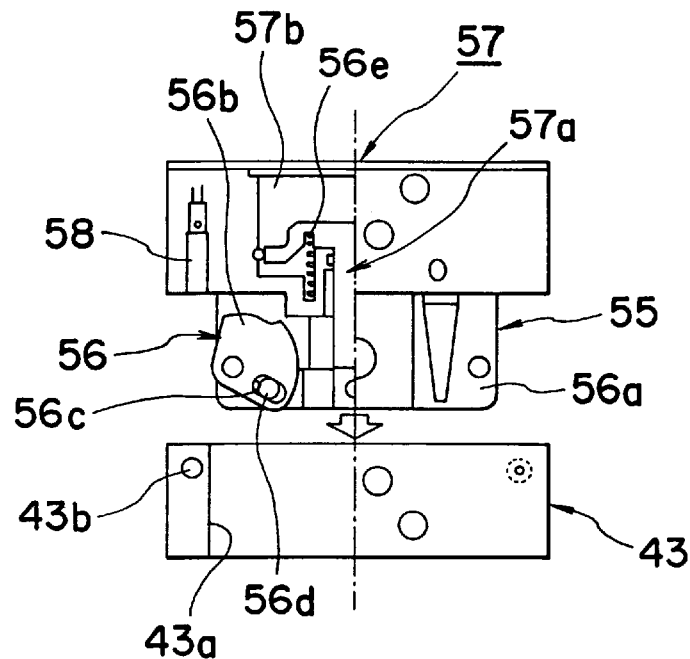
FIGS. 19A, 19B and 19C are diagrams showing an operation of an engaging mechanism of a wafer guide and the wafer holder.
Figure 19B:
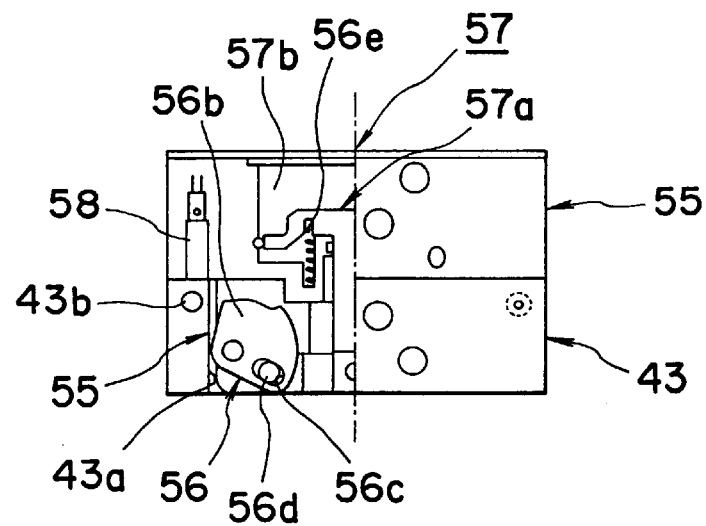
Figure 19C:
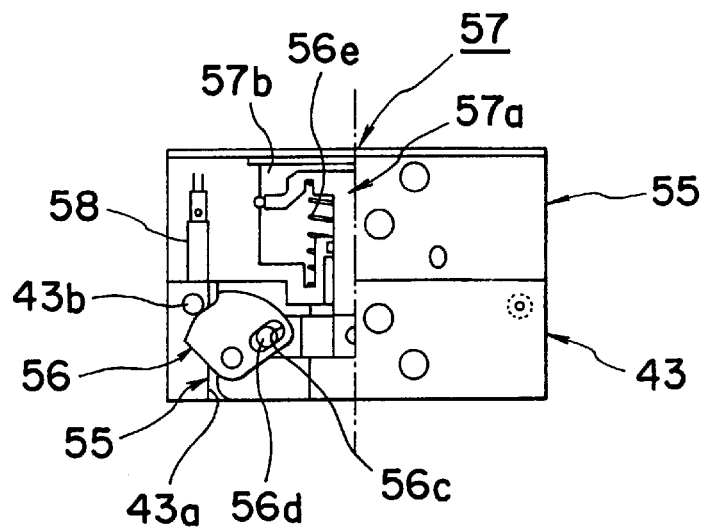

The carrier member 54 is provided, on a lower end thereof, with an engagement part 55. As shown in FIG. 19A, the engagement part 55 has a projecting part 56a, while the engagement part 43 of the wafer holder 40 is provided with a concave part 43a into which the projecting part 56a is inserted.

We now describe a mechanism 56 for engaging the engagement part 55 of the carrier member 54 with the engagement part 43 of the wafer holder 40. Note, the mechanism 56 will be referred as "engaging mechanism", hereinafter.

As especially shown in FIG. 19A, the engagement mechanism 56 is mainly constituted by a locking cam 56b which is rotatable on the projecting part 56a about a pivotal axis oriented horizontally and a pneumatic cylinder 57 which is positioned in the carrier member 54. Provided in the concave part 43a is a lock pin 43b which projects in the horizontal direction and which is engageable with the locking cam 56b on its pivotal movement.

The locking cam 56b has an elongated hole 56c formed to extend toward a pivotal center of the cam 56b. The locking cam 56b is associated with a piston rod 57a of the pneumatic cylinder 57 through the intermediary of a pin 56d rotatably and slidably engaging in the elongated hole 56c. The pneumatic cylinder 57 is adapted so as to operate on condition that the approach of the engagement part 55 to the engagement part 43 has been detected by a proximity sensor 58 mounted on a base of the engagement part 55. Arranged between a piston part 57b of the piston rod 57a and an end of the pneumatic cylinder 57 is a spring 56e which stabilizes the position of the locking cam 56b. The spring 56e applies a force for breaking the engagement of the locking cam 56b with the lock pin 43b, on the piston rod 57a.

In order to engage the wafer guide 50 with the wafer holder 40 by the engagement mechanism 56, the pneumatic cylinder 57 is actuated to expand the piston rod 57a, as shown in FIG. 19A. Then, while moving the locking cam 56b to the unlocking side, the projecting part 56a is inserted into the concave part 43a of the engagement part 43. (see FIG. 19B)

Next, when it is detected that the engagement part 55 approaches the engagement part 43 by the proximity sensor 58, then the pneumatic cylinder 57 is actuated to shrink the piston rod 57a. Consequently, the locking cam 56b is rotated to engage with the lock pin 43b, so that the wafer guide 50 engages with the wafer holder 40 (see FIG. 19C). Note, in order to disengage the wafer guide 50 from the wafer holder 40, the pneumatic cylinder 57 has only to be operated to expand the piston rod 57a for breaking the engagement of the locking cam 56b with the lock pin 43b.

Figure 20:
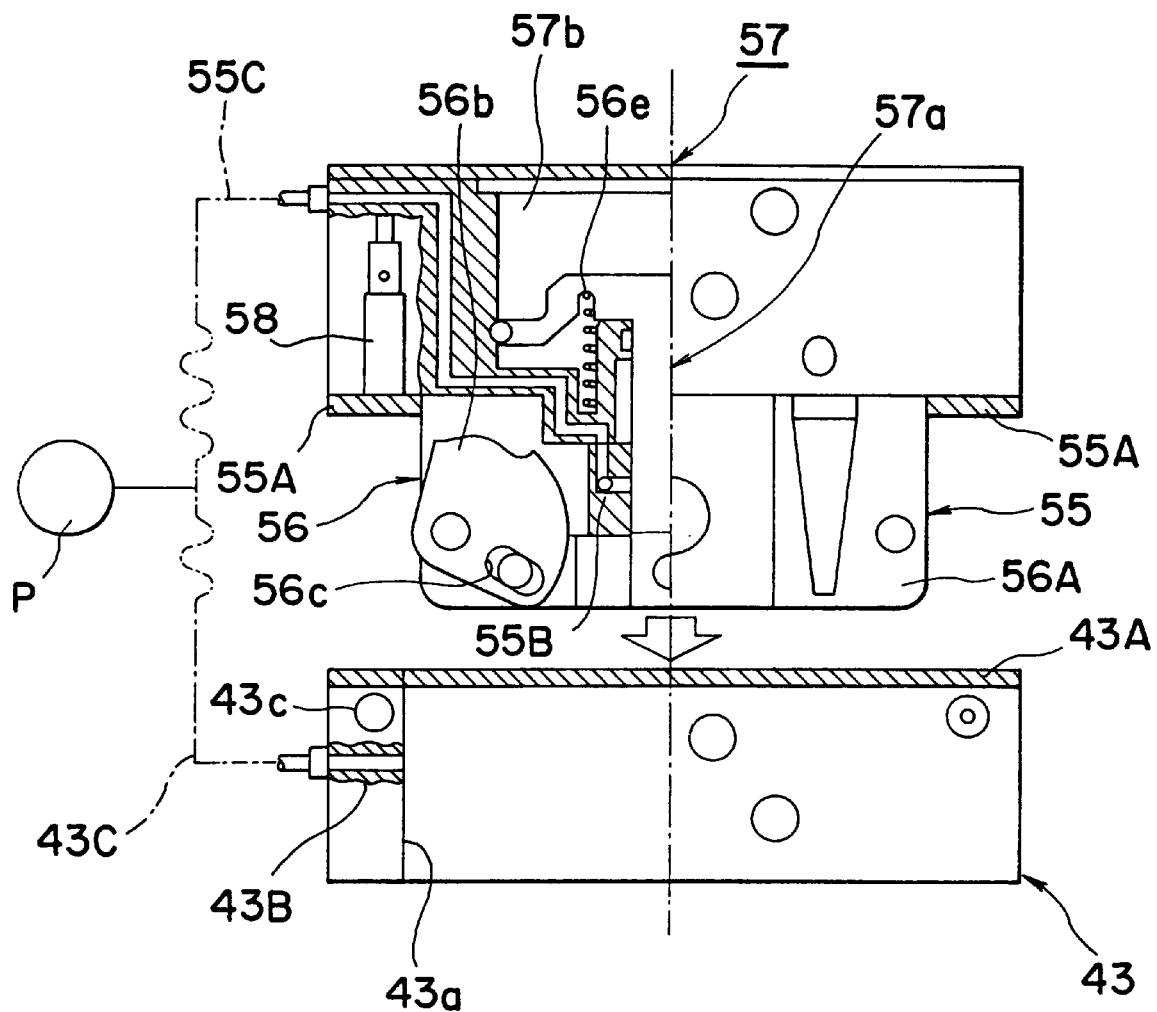
FIG. 20 is an essential cross sectional view showing a modification of the engaging mechanism of the wafer guide and the wafer holder.
Figure 21:
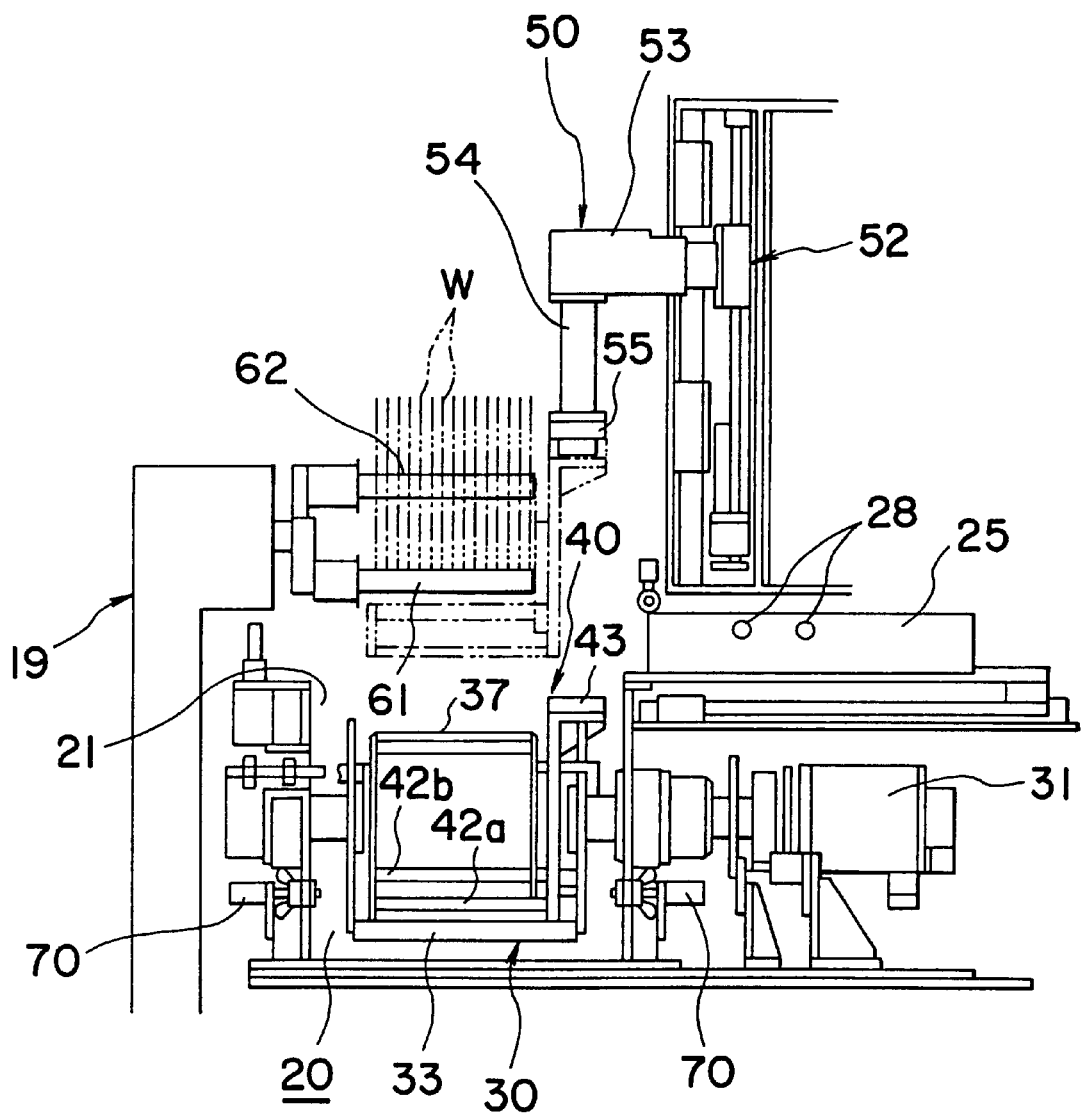
Figure 22A:
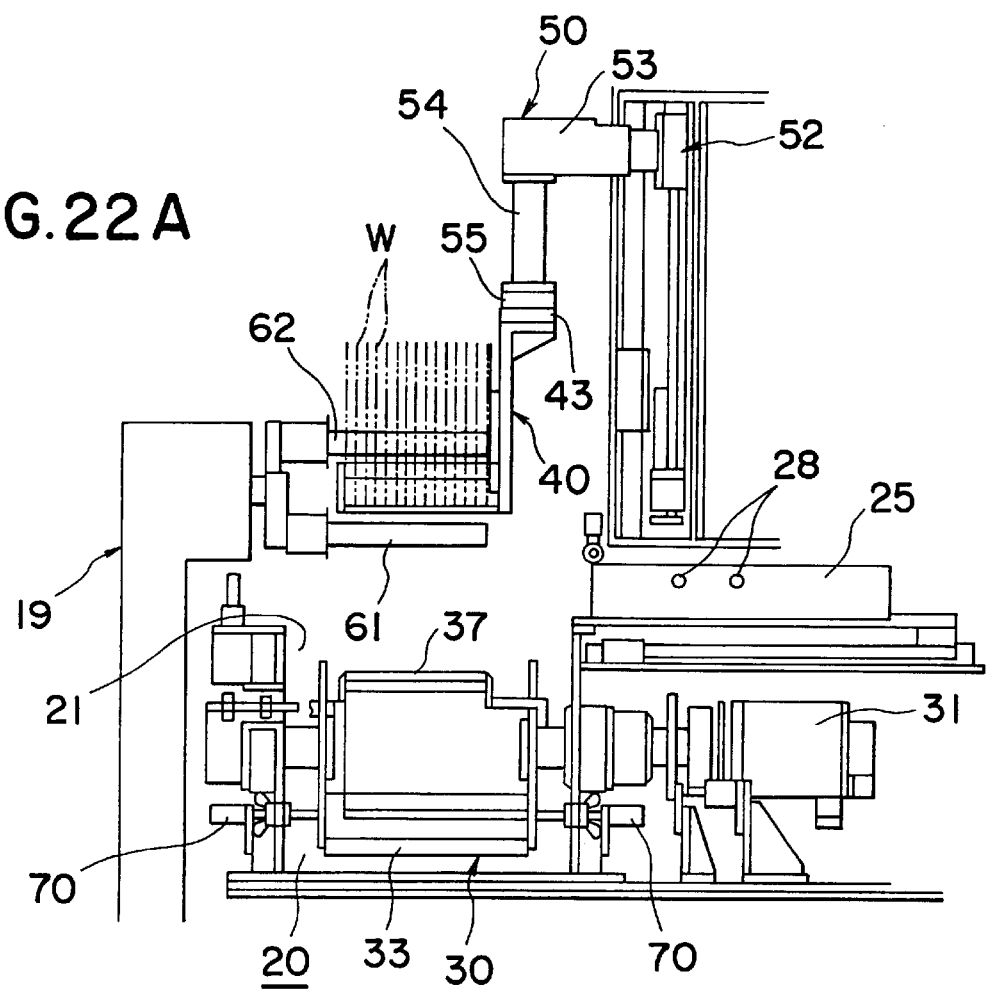
FIG. 22A is a schematic cross sectional view showing an operation to deliver the wafers from the wafer transfer chuck to the wafer holder and FIG. 22B is a schematic side cross sectional view of FIG. 22A.
Figure 22B:
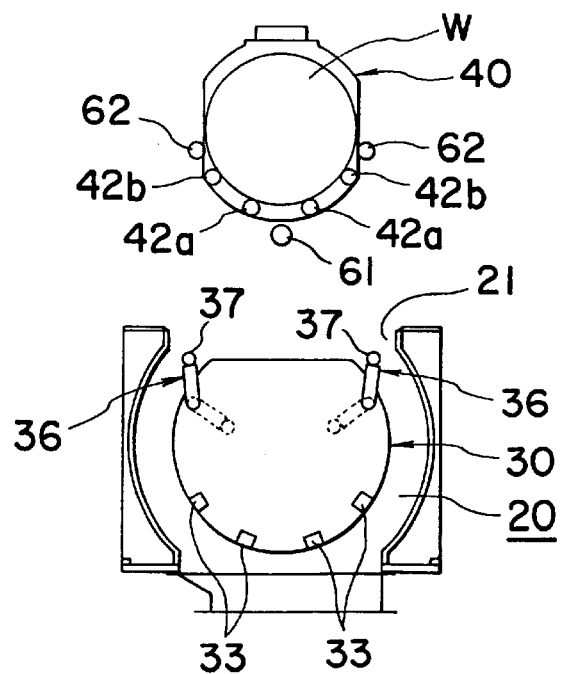
Figure 23A:
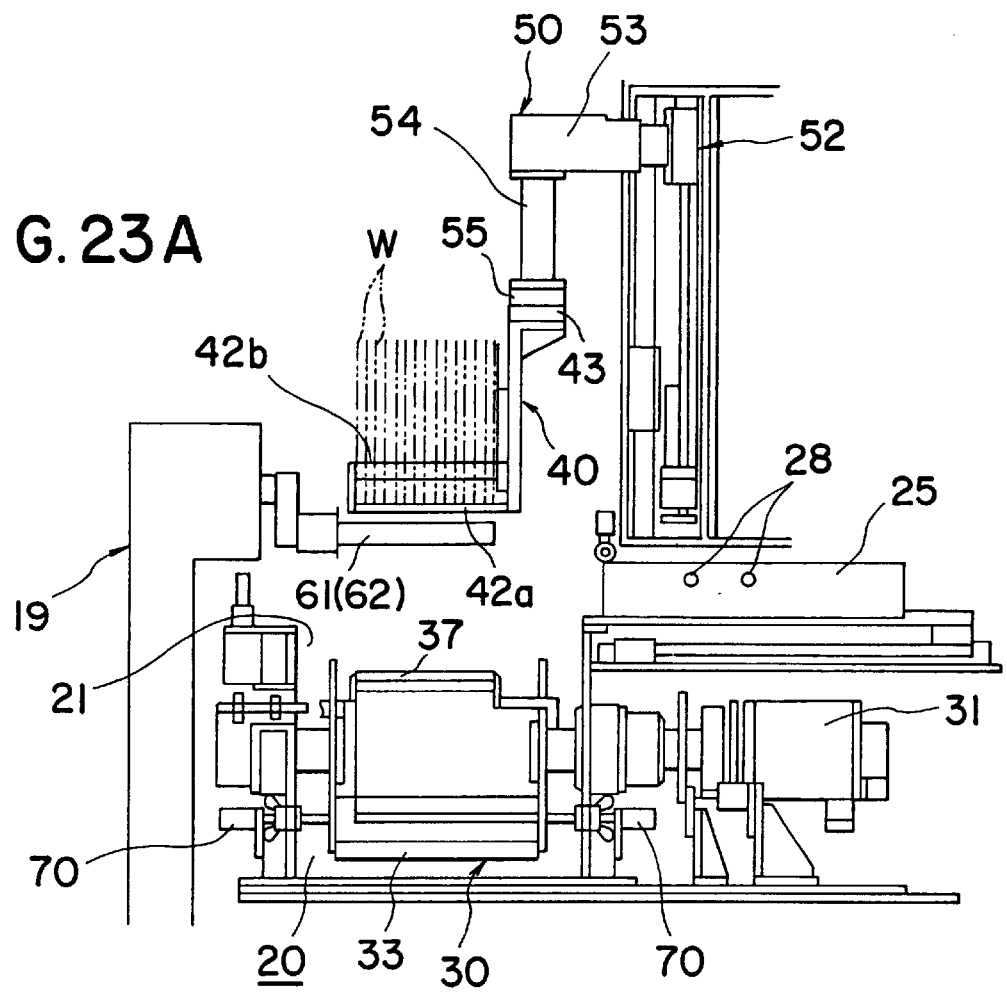
FIG. 23A is a schematic cross sectional view showing a condition after delivering the wafers to the wafer holder and FIG. 23B is a schematic side cross sectional view of FIG. 23A.
Figure 23B:
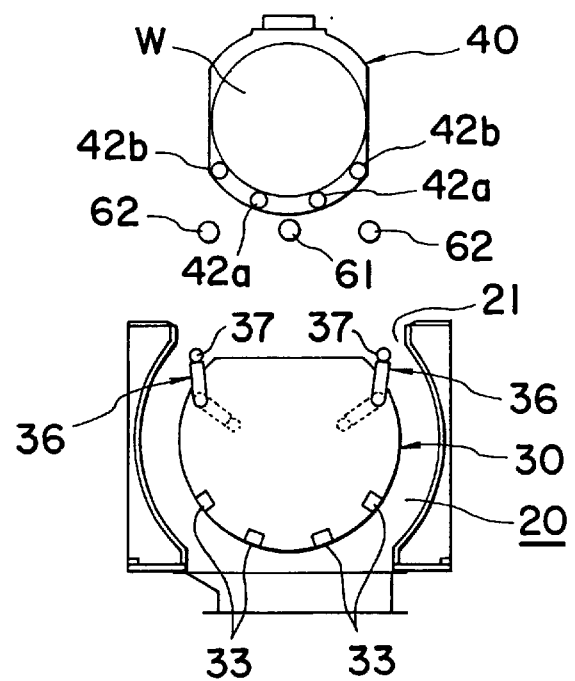
Figure 24A:
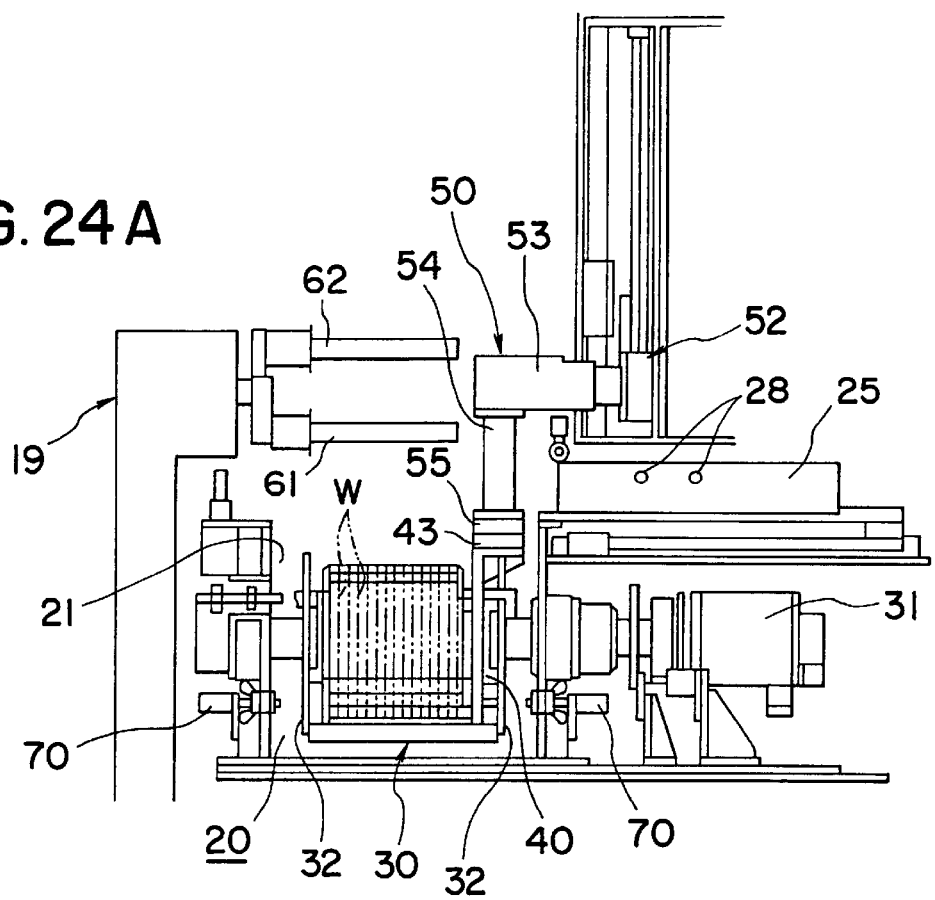
FIG. 24A is a schematic cross sectional view showing a condition that the wafer holder is installed in the rotor and FIG. 24B is a schematic side cross sectional view of FIG. 24A.
Figure 24B:
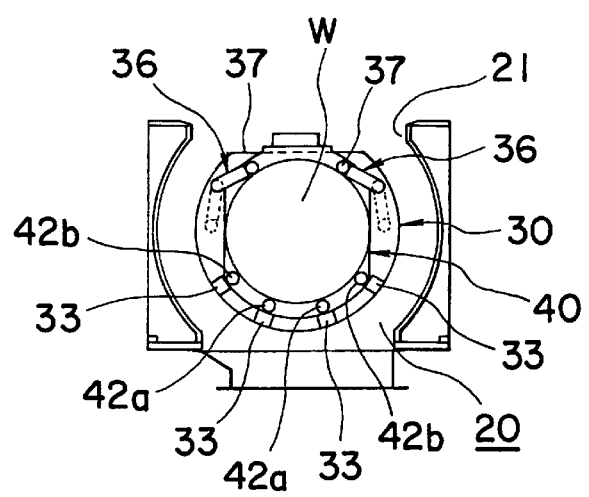
Figure 25A:
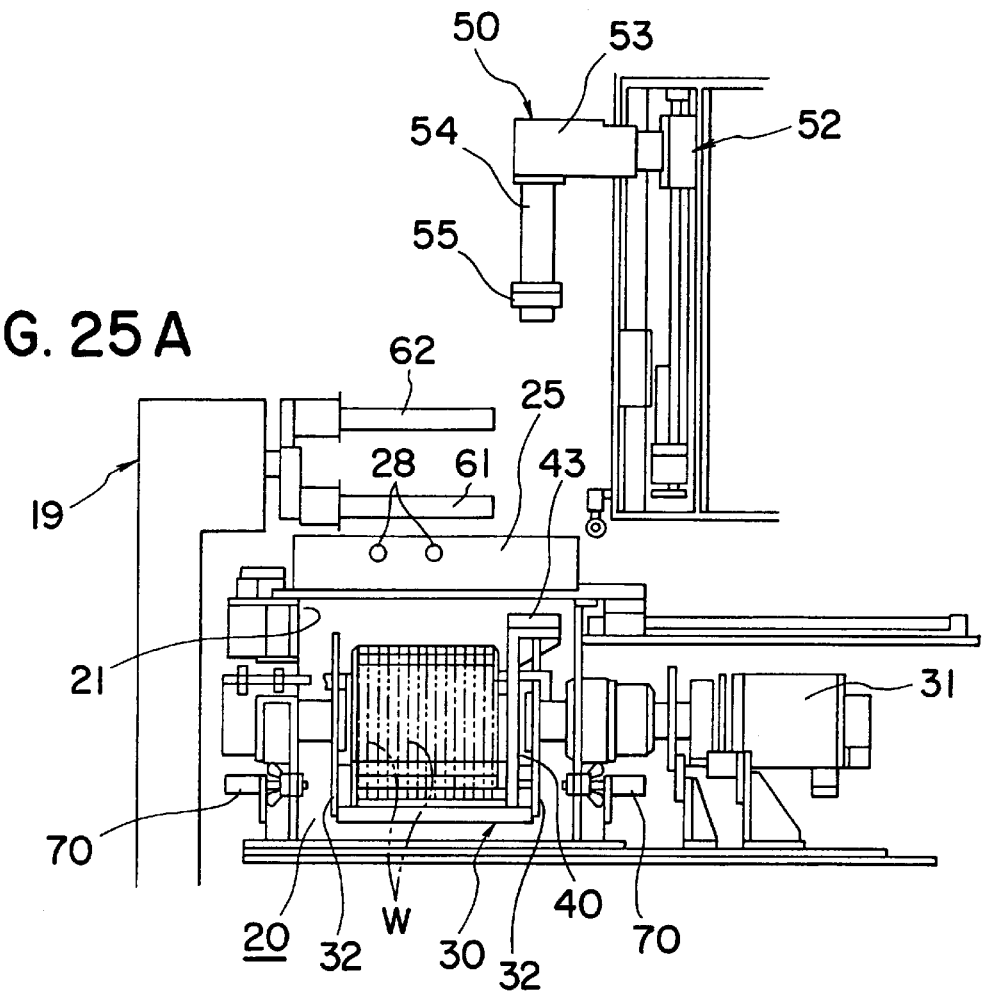
Figure 25B:
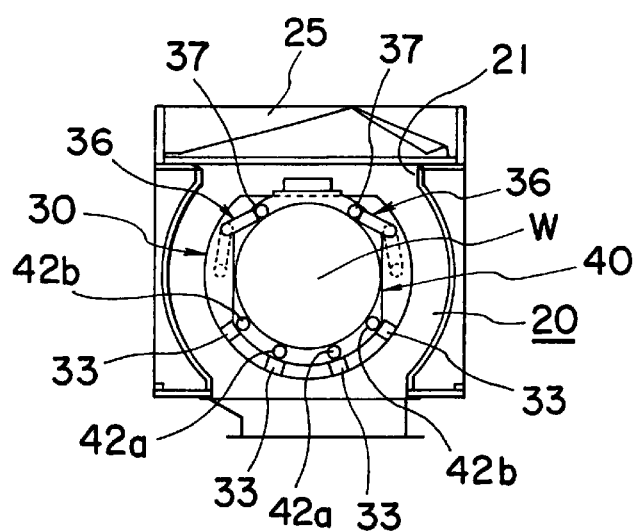

As shown in FIG. 20, it is preferable that the top face of the engagement part 43 is covered with a plate-shaped coating member 43A of synthetic resins, such as PEEK (polyether ethreketone) resin and FPFE (polytetrafluoroethylene) resin. Additionally, it is also preferable that the engagement part 55 of the wafer guide 50 has a coating member 55A of the similar material formed on a surface of the part 55 coming in contact with the engagement part 43. Such a coating member may be formed on a surface of the locking cam 56b and/or a surface of the lock pin 43b and a surface of the piston rod 57a, too. Of course, the coating members (coating layers) are not necessarily formed on both of the engagement part 43 and the engagement part 45. Thus, at least one of the surfaces of the engagement parts 43 and 45 has only to be covered with the coating member. Further, the coating layer may be composed of a film of PEEK resin, PTFE resin or the like.

Owing to the provision of the coating layer, it is possible to avoid metal contacts, which might be caused by the expansion and contraction of the piston rod 57a and the rotation of the piston rod 57a etc., in case of engaging the wafer guide 50 with the wafer holder 40. Consequently, with the prevention of occurrence of particles, such as metal power, it is possible to prevent the particles from sticking to the wafers W, whereby the drying process can be accomplished in a clean atmosphere. Additionally, it is possible to improve wear and abrasion resistance of the engagement parts 43 and 55.

As shown in FIG. 20, it is preferable to provide the engagement part 55 and the engagement part 43 with a discharging passage 55B and a discharging passage 43B, respectively. In this case, one end of the discharging passage 55B is connected with a vacuum pump P through the intermediary of a pipe 55C. The other end of the discharging passage 55B opens at a portion of the engagement part 55 close to the movable part of the piston rod 57a. One end of the discharging passage 43B is connected with a vacuum pump P through the intermediary of a pipe 43C. The other end of the discharging passage 43B opens at a portion of the engagement part 43 close to the movable part of the locking cam 56b. The pipes 43C, 55C for connecting the vacuum pump P with the discharging passages 43B, 55B are constructed flexibly so as to correspond to the respective movements of the wafer holder 40 and the wafer guide 50.

Owing to the provision of the discharging passages 43B, 55B, even if the particles, such as metal powder, are produced due to metal contacts in engaging the wafer guide 50 with the wafer holder 40, it is possible to suck the particles from the openings of the exhaust passages 43B, 55B. Thus, the sticking of the particles on the wafers W can be prevented, thereby realizing the drying process in the clean atmosphere.

Next, the drying steps of the wafers W will be described with reference to FIGS. 21 to 25B. At first, after the wafers W are subjected to the predetermined chemical and cleaning process by the first to third processing units 14, 15, 16 of the processing section 3, the wafer transporting chuck 19 moves to the side of the drying chamber 20 while carrying the wafers W. In this way, the wafers W are brought into a position above the loading and unloading port 21 of the drying chamber 20 (see FIG. 21).

Then, the wafer guide 50 engaging with the wafer holder 40 rises to hold the wafers W by the wafer support 42, i.e., the lower supporting rods 42a and the side supporting rods 42b. Simultaneously, the movable retaining rods 62 are rotated to the respective positions of two-dot chain lines of FIG. 8B to release the wafers W. In this way, the wafers W, which have been retained upright in a row by the wafer transporting chuck 19, are delivered to the wafer holder 40 while keeping such a posture of the wafers W and a distance between the adjoining wafers W (see FIGS. 22A, 22B, 23A and 23B).

Thereafter, when the wafer transporting chuck 19 retreats from the upside of the drying chamber 20 and does not interfere with the wafer guide 50, then the wafer guide 50 is lowered. Subsequently, the wafer guide 50 inserts the wafer holder 40 carrying the wafers W into the drying chamber 40 and between the opposing circular discs 32 of the rotor 30 (see FIGS. 24A and 24B). Then, with the operation of the engagement mechanism 56, the engagement of the wafer guide 50 with the wafer holder 40 is broken, so that the wafer guide 50 rises again and retreats out of the drying chamber 20.

At the same time, the wafer holder 40 is fixed to the rotor 30 by the locking mechanism 70. Meanwhile, the top portions of the wafers W are urged downward by the retaining arms 36. Further, the lid body 25 is moved by the rod-less cylinder 25b to close the unloading and loading port 21 and thereafter, the lid body 25 is brought into tight contact with the port 21 by the pneumatic cylinder 27a (see FIGS. 5A, 5B, 25A and 25B).

Next, the rotor 30 is rotated by the motor 31, for eliminating moisture sticking to the wafers W. At this time, the exhaust fan 22 discharges the air in the drying chamber 20 to the side of the exhaust pipe 23 through the exhaust port 24. While discharging the air in the drying chamber 20, the air cleaned through the filter fan unit 29 is introduced into the drying chamber 20 through the air inlet 25c and successively discharged to the side of the exhaust pipe 23 together with the waterdrops scattered due to the rotation of the rotor 30. Owing to this current of air, the effective drying process can be realized since no scattered waterdrop sticks to the wafers W again.

With the completion of drying process, the lid body 25 is moved to open the unloading and loading port 21. Next, the wafer guide 50 is lowered to engage with the wafer holder 40. Thereafter, the retaining arm 36 is rotated apart from the wafer W, while the rotor 30 is disengaged from the wafer holder 40 by the unlocking mechanism 77. Sequentially, the wafer guide 50 is elevated to take out the wafer holder 40 and the dried wafers W above the drying chamber 20. By the operations reverse to the aforementioned steps, the wafers W are delivered from the wafer holder 40 to the wafer transporting chuck 19 and successively, transported to the next process by the chuck 19.

Although the above-mentioned embodiment is related to the application of the substrate drying apparatus on the semiconductor wafer cleaning system, the drying apparatus of the invention is applicable to any processing system besides the cleaning process, of course. Furthermore, it is a matter of course that the present invention is applicable for a process for drying LCD glass substrates or the like, besides the semiconductor wafers.

What is claimed is:

1. A drying apparatus for drying substrates to be processed, comprising:

a drying chamber provided, on an upper part thereof, with an unloading and loading port through which said substrates are unloaded and loaded;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder; and a substrate holder transporting device for transporting said substrate holder arranged outside said drying chamber, said transporting device being capable of moving said substrate holder between a delivery position outside said drying chamber allowing said substrate holder to accept and release the substrates, and an engagement position inside said drying chamber allowing said substrate holder to engage with said rotor, wherein said transporting device has an engagement part located outside said drying chamber and engageable with said substrate holder, said engagement part being capable of moving into said drying chamber and said engagement part located outside said drying chamber during drying operation.

2. A drying apparatus for drying substrates to be processed, comprising:

a drying chamber provided, on an upper part thereof, with an unloading and loading port through which said substrates are unloaded and loaded;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder; and a substrate holder transporting device for transporting said substrate holder, arranged outside said drying chamber and engageable with said substrate holder, said transporting device being capable of moving said substrate holder between a delivery position outside said drying chamber, allowing said substrate holder to accept and release the substrates, and an engagement position inside said drying chamber, allowing said substrate holder to engage with said rotor, wherein said substrate holder and said transporting device include respective engagement parts for engagement with each other, and said engagement parts of said substrate holder and said transporting device are coated with synthetic resinous layers, respectively.

3. A drying apparatus for drying substrates to be processed, comprising:

a drying chamber provided, on an upper part thereof, with an unloading and loading port through which said substrates are unloaded and loaded;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder; and a substrate holder transporting device for transporting said substrate holder arranged outside said drying chamber and engageable with said substrate holder, said transporting device being capable of moving said substrate holder between a delivery position outside said drying chamber allowing said substrate holder to accept and release the substrates, and an engagement position inside said drying chamber allowing said substrate holder to engage with said rotor, wherein said substrate holder and said transporting device include respective engagement parts for engagement with each other, said engagement part of said substrate holder having a constituent element, and engagement part of said transporting device having a constituent element, said constituent elements of said substrate holder and said transporting device being engageable with each other, and at least one of said constituent elements is coated with a synthetic resinous layer.

4. A drying apparatus for drying substrates to be processed, comprising:

a drying chamber provided, on an upper part thereof, with an unloading and loading port through which said substrates are unloaded and loaded;

a substrate holder which retains said substrates in a manner that said substrates stand upright and line up along a horizontal direction;

a rotor disposed in said drying chamber so as to rotate about as horizontal rotational axis as a center, said rotor being engageable with said substrate holder; and a substrate holder transporting device for transporting said substrate holder arranged outside said drying chamber and engageable with said substrate holder, said transporting device being capable of moving said substrate holder between a delivery position outside said drying chamber allowing said substrate holder to accept and release the substrates, and an engagement position inside said drying chamber allowing said substrate holder to engage with said rotor, wherein said substrate holder and said transporting device include respective engagement parts for engagement with each other, said engagement parts of said substrate holder and said transporting device have respective engagement mechanism for engaging said substrate holder with said transporting device, and engagement parts of said substrate holder and said transporting device are respectively provided with discharging passages of which leading ends are opened at respective positions adjacent to said engagement mechanisms.

5. A drying apparatus for drying substrates to be processed, comprising:

a drying chamber provided, on an upper part thereof, with an unloading and loading port through which said substrates are unloaded and loaded;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder; and a substrate holder transporting device for transporting said substrate holder arranged outside said drying chamber and engageable with said substrate holder, said transporting device being capable of moving said substrate holder between a delivery position outside said drying chamber allowing said substrate holder to accept and release the substrates, and an engagement position inside said drying chamber allowing said substrate holder to engage with said rotor; and a lid body which is capable of opening and closing said unloading and loading port of the drying chamber, wherein said lid body has an inner face facing said drying chamber and inclining to a horizontal plane, said inner face having an edge located at a higher end thereof, said lid body having air inlet arranged in a position adjacent to said edge of said inner face for introducing air into said drying chamber, said drying chamber provided with an exhaust port for discharging the air introduced through said air inlet, and said edge of said inner face is positioned, with respect to a horizontal direction perpendicular to said axis of said rotor, outside peripheries of said substrates retained by said substrate holder engaging with said rotor.

6. The drying apparatus as claimed in claim 5, wherein said inner face of said lid body is coated with a layer exhibiting corrosion resistance and water repellent characteristics.

7. The drying apparatus as claimed in claim 5, further comprising:

a horizontal moving mechanism for moving said lid body in the horizontal direction; and a closing mechanism for moving said lid body toward said unloading and loading port of said drying chamber to apply said lid body on said unloading and loading port tightly.

8. The drying apparatus as claimed in claim 1, further comprising:

a fixing mechanism for fixing said substrate holder on said rotor, said fixing mechanism having:

an engagement member arranged on said rotor to be approachable to and separable from said substrate holder;

a receiving part arranged on said substrate holder, for engagement with said engagement member of said rotor; and means for driving said engagement member to and from said receiving part of said substrate holder.

9. The drying apparatus as claimed in claim 1, wherein said substrate holder has a supporting part for supporting said substrates from underside thereof; and wherein said rotor includes substrate holding means for holding down said substrates from upside thereof, when said substrate holder is engaging with said rotor.

10. The drying apparatus as claimed in claim 9, wherein said substrate holding means of said rotor comprises:

an arm attached to said rotor so as to pivot on a horizontal axis;

a holding member extending from a free end of said arm, for holding respective upper portions of said substrates; and means for rotating said arm.

11. The drying apparatus as claimed in claim 1, further comprising nozzles for ejecting a cleaning liquid against said rotor.

12. The drying apparatus as claimed in claim 1, wherein said delivery position is located vertically above said engagement position.

13. A drying apparatus for drying substrates to be processed, comprising:

a drying chamber provided with an unloading and loading port;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder;

a substrate holder transporting device for transporting said substrate holder arranged outside said drying chamber, said transporting device being capable of moving said substrate holder between a delivery position outside said drying chamber allowing said substrate holder to accept and release the substrates, and an engagement position inside said drying chamber allowing said substrate holder to engage with said rotor; and a substrate transporting device for transporting said substrates, which has been conveyed to said drying apparatus from outside thereof, to said delivery position, wherein said transporting device has an engagement part located outside said drying chamber and engageable with said substrate holder, said engagement part being capable of moving into said drying chamber, and said engagement part positioned outside said drying chamber during drying operation.

14. A method of drying substrates to be processed, said method comprising the steps of:

delivering said substrates, which are retained in a manner that said substrates stand upright and line up along a horizontal direction by a substrate transporting device, from said substrate transporting device to a substrate holder retained by an engagement part of a substrate holder transporting device while maintaining a posture of said substrates retained by said substrate transporting device;

moving said substrate holder downward by said substrate holder transporting device whereby said substrate holder moves into a drying chamber;

engaging said substrate holder with a rotor in said drying chamber;

releasing said substrate holder from said engagement part of said substrate holder transporting device;

moving said engagement part of substrate transporting device upward thereby withdrawing said engagement part of said substrate transporting device from said drying chamber;

closing said drying chamber with a lid body; and rotating said rotor to eliminate liquids from respective surfaces of said substrates when said engagement part of said substrate transporting device is positioned outside said drying chamber.

15. A drying apparatus for drying substrates to be processed, comprising:

a drying chamber provided with an unloading and loading port;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder;

a substrate holder transporting device for transporting said substrate holder, arranged outside said drying chamber, said substrate holder transporting device being capable of moving said substrate holder between a delivery position outside said drying chamber allowing said substrate holder to accept and release the substrates, and an engagement position inside said drying chamber allowing said substrate holder to engage with said rotor; and a substrate transporting device for transporting said substrates, which has been conveyed to said drying apparatus from outside thereof, to said delivery position wherein said substrate holder and said substrate holder transporting device include respective engagement parts for engagement with each other, and said engagement parts of said substrate holder and said substrate holder transporting device are coated with synthetic resinous layers, respectively.

16. A drying apparatus for drying substrates to be processed, comprising:

a drying chamber provided with an unloading and loading port;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder;

a substrate holder transporting device for transporting said substrate holder arranged outside said drying chamber, said substrate holder transporting device being capable of moving said substrate holder between a delivery position outside said drying chamber allowing said substrate holder to accept and release the substrates, and an engagement position inside said drying chamber allowing said substrate holder to engage with said rotor; and a substrate transporting device for transporting said substrates, which has been conveyed to said drying apparatus from outside thereof, to said delivery position, wherein said substrate holder and said substrate holder transporting device include respective engagement parts for engagement with each other, said engagement part of said substrate holder having a constituent element, engagement part of said substrate holder transporting device having a constituent element, said constituent elements of said substrate holder and said substrate holder transporting device being engageable with each other, and at least one of said constituent elements is coated with a synthetic resinous layer.

17. A drying apparatus for drying substrates to be processed, comprising:

a drying chamber provided with an unloading and loading port;

a substrate holder which retains said substrates in a manner that said substrates stand upright and line up along a horizontal direction;

a rotor disposed in said drying chamber so as to rotate about a horizontal rotational axis as a center, said rotor being engageable with said substrate holder;

a substrate holder transporting device for transporting said substrate holder arranged outside said drying chamber, said transporting device being capable of moving said substrate holder between a delivery position outside said drying chamber allowing said substrate holder to accept and release the substrates, and an engagement position inside said drying chamber allowing said substrate holder to engage with said rotor; and a substrate transporting device for transporting said substrates, which has been conveyed to said drying apparatus from outside thereof, to said delivery position, wherein said substrate holder and said transporting device include respective engagement parts for engagement with each other, said engagement parts of said substrate holder and said substrate holder transporting device have respective engagement mechanism for engaging said substrate holder with said substrate holder transporting device, and engagement parts of said substrate holder and said substrate holder transporting device are respectively provided with discharging passages of which leading ends are opened at respective positions adjacent to said engagement mechanisms.

* * * * *